US006493365B1

(12) United States Patent
Wu et al.

(10) Patent No.: US 6,493,365 B1
(45) Date of Patent: *Dec. 10, 2002

(54) PASSIVE THERMAL STABILIZATION OF THE OPTICAL PATH LENGTH IN A TUNABLE LASER

(75) Inventors: I-Fan Wu, Fremont, CA (US); Alexander V. Tuganov, Redwood City, CA (US); Kenneth C. Reiter, San Jose, CA (US); Timothy Day, San Jose, CA (US); Alejandro D. Farinas, Mountain View, CA (US)

(73) Assignee: New Focus, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/393,755

(22) Filed: Sep. 10, 1999

Related U.S. Application Data

(60) Provisional application No. 60/099,901, filed on Sep. 11, 1998, provisional application No. 60/100,055, filed on Sep. 11, 1998, provisional application No. 60/099,839, filed on Sep. 11, 1998, provisional application No. 60/099,865, filed on Sep. 11, 1998, and provisional application No. 60/099,831, filed on Sep. 11, 1998.

(51) Int. Cl.$^7$ .............................. H01S 3/10; H01S 3/04; H01S 3/20; H01S 3/08
(52) U.S. Cl. .............................. 372/20; 372/9; 372/34; 372/54; 372/99; 372/107
(58) Field of Search .................. 372/20, 9, 36, 372/29.02, 32, 34, 102, 107, 54, 92, 93

(56) References Cited

U.S. PATENT DOCUMENTS

| 3,967,211 A | 6/1976 | Itzkan et al. |
| 4,309,671 A | 1/1982 | Malyon |
| 4,504,950 A | 3/1985 | AuYeung |
| 4,560,246 A | 12/1985 | Cotter |

(List continued on next page.)

FOREIGN PATENT DOCUMENTS

| EP | 0924628 | 8/1998 |
| WO | WO 98/44424 | 10/1998 |

OTHER PUBLICATIONS

Favre, et al. "External–Cavity Semiconductor Laser With 15 nm Continuous Tuning Range", Electronics Letters, Jun. 19, 1996.
Macleod, H.A. *Thin Film Optical Filters* 2$^{nd}$ Edition, McGraw–Hill, 1989, pp. 244–269.

(List continued on next page.)

*Primary Examiner*—Paul Ip
*Assistant Examiner*—Armando Rodriguez
(74) *Attorney, Agent, or Firm*—Alan W. Cannon; Bozicevic, Field & Francis LLP

(57) ABSTRACT

The present invention provides an apparatus for passively stabilizing the optical pathlength in tunable lasers. Lasers stabilized using the passive stabilization apparatus exhibit reduced mode hop and increased wavelength stability during temperature variations of the laser or surrounding environment. The stabilization makes the laser suitable for a broad range of applications including: optical signal generators and optical multimeters.

33 Claims, 21 Drawing Sheets

U.S. PATENT DOCUMENTS

| | | | |
|---|---|---|---|
| 4,583,227 A | * | 4/1986 | Kirkby .................. 372/32 |
| 4,770,047 A | | 9/1988 | Arditty et al. |
| 4,796,270 A | * | 1/1989 | Sheng et al. .................. 372/54 |
| 4,839,614 A | | 6/1989 | Hill et al. |
| 4,843,233 A | | 6/1989 | Jeunhomme |
| 4,870,269 A | | 9/1989 | Jeunhomme et al. |
| 4,932,782 A | | 6/1990 | Graindorge et al. |
| 4,994,677 A | | 2/1991 | Graindorge |
| 5,028,395 A | | 7/1991 | Sebille et al. |
| 5,050,179 A | | 9/1991 | Mooradian |
| 5,058,124 A | | 10/1991 | Cameron et al. |
| 5,103,457 A | | 4/1992 | Wallace et al. |
| 5,115,677 A | | 5/1992 | Martin et al. |
| 5,141,316 A | | 8/1992 | Lefevre et al. |
| 5,172,185 A | | 12/1992 | Leuchs et al. |
| 5,181,078 A | | 1/1993 | Lefevre et al. |
| 5,185,643 A | | 2/1993 | Vry et al. |
| 5,218,610 A | | 6/1993 | Dixon |
| 5,225,930 A | | 7/1993 | Land et al. |
| 5,270,791 A | | 12/1993 | Lefevre et al. |
| 5,305,330 A | | 4/1994 | Rieder et al. |
| 5,319,668 A | | 6/1994 | Lueke |
| 5,321,717 A | | 6/1994 | Adachi et al. |
| 5,327,447 A | | 7/1994 | Mooradian |
| 5,331,651 A | | 7/1994 | Becker et al. |
| 5,347,527 A | | 9/1994 | Favre et al. |
| 5,349,440 A | | 9/1994 | DeGroot |
| 5,373,515 A | | 12/1994 | Wakabayashi et al. |
| 5,387,974 A | | 2/1995 | Nakatani |
| 5,412,474 A | | 5/1995 | Reasenberg et al. |
| 5,420,687 A | | 5/1995 | Kachanov |
| 5,428,700 A | | 6/1995 | Hall |
| 5,438,579 A | | 8/1995 | Eda et al. |
| 5,450,202 A | | 9/1995 | Tisue |
| 5,473,625 A | | 12/1995 | Hansen et al. |
| 5,543,916 A | | 8/1996 | Kachanov |
| 5,583,638 A | | 12/1996 | Cutler |
| 5,594,744 A | | 1/1997 | Lefevre et al. |
| 5,606,439 A | | 2/1997 | Wu |
| 5,631,736 A | | 5/1997 | Thiel et al. |
| 5,712,704 A | | 1/1998 | Martin et al. |
| 5,719,674 A | | 2/1998 | Martin et al. |
| 5,737,109 A | | 4/1998 | Goodwin |
| 5,760,391 A | | 6/1998 | Narendran |
| 5,802,085 A | | 9/1998 | Lefevre et al. |
| 5,825,792 A | | 10/1998 | Villenueve et al. |
| 5,886,785 A | | 3/1999 | Lefevre et al. |
| 5,946,331 A | | 8/1999 | Amersfoort et al. |
| 5,991,061 A | | 11/1999 | Adams et al. |
| 6,043,883 A | | 3/2000 | Leckel et al. |
| 6,061,369 A | | 5/2000 | Conradi |
| 6,084,695 A | | 6/2000 | Martin et al. |
| 6,108,355 A | | 8/2000 | Zorabedian |
| 6,115,401 A | | 9/2000 | Scobey et al. |
| RE37,044 E | | 2/2001 | Wu |
| 6,192,058 B1 | | 2/2001 | Abeles |
| 6,324,204 B1 | | 2/2001 | Deacon |
| 6,205,159 B1 | | 3/2001 | Sesko et al. |
| 6,243,517 B1 | | 6/2001 | Deacon |
| 6,246,480 B1 | | 6/2001 | O'Brien |
| 6,249,364 B1 | | 6/2001 | Martin et al. |
| 6,252,718 B1 | | 6/2001 | Lefevre |
| 6,282,215 B1 | | 8/2001 | Zorabedian et al. |
| 6,304,586 B1 | | 10/2001 | Pease et al. |
| 6,321,011 B2 | | 11/2001 | Deacon |
| 6,330,253 B1 | | 12/2001 | Tuganov et al. |
| 6,331,892 B1 | | 12/2001 | Green |

OTHER PUBLICATIONS

Mellis et al. "Miniature Packaged External–Cavity Semiconductor Laser With 50 Ghz Continuous Electrical Tuning Range" Electronics Letters, Apr. 22, 1988.

Rosenberg, K.P. et al. "Logarithmically Variable Infrared Etalon Filters," SPIE, vol. 2262/223, pp. 223–232.

Scobey & Stupik, Stable Ultra–Narrow Bandpass Filters, SPIE, vol. 2262, pp. 37–46.

Siegman A.E. "An Introduction to Lasers and Masers," Mc–Graw–Hill, Inc. 1971.

Takashashi, H. "Temperture Stability of Thin–Film Narrow–Bandpass Filters Produced by Ion–Assisted Deposition" Applied Optics, vol. 34, No. 4, Feb. 1, 1995.

Yoder, *Optical Instrument Structural Design*, pp. 612–619.

Zhang, X.X., "An Interference Filter Based External Cavity Laser For Dense Wavelength Division Multiplexing Applications" Coring OCA Corp. pp. 103–108.

* cited by examiner

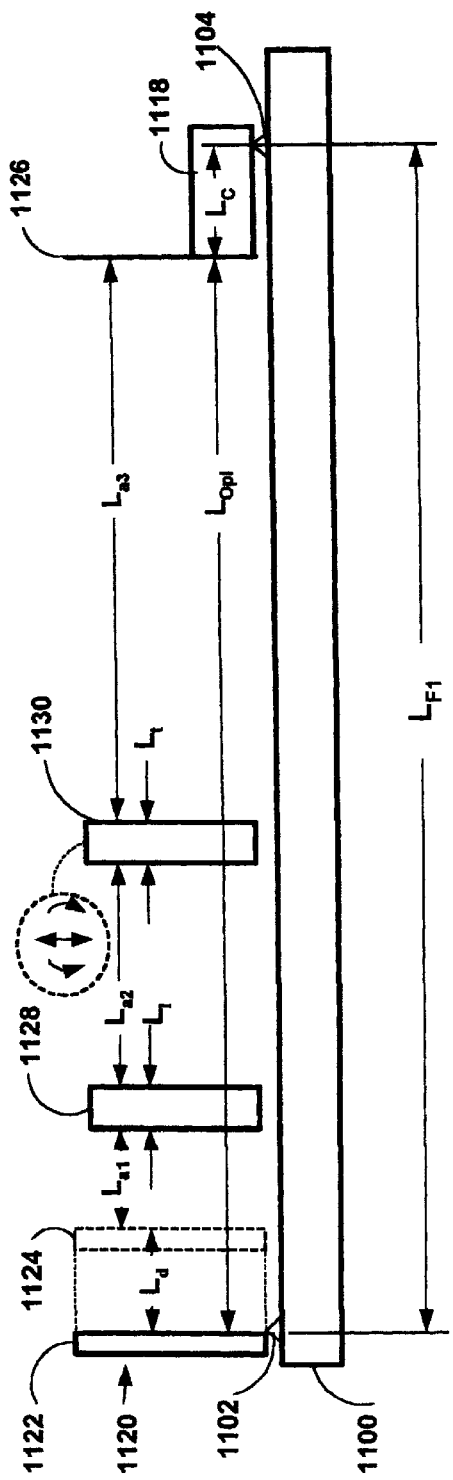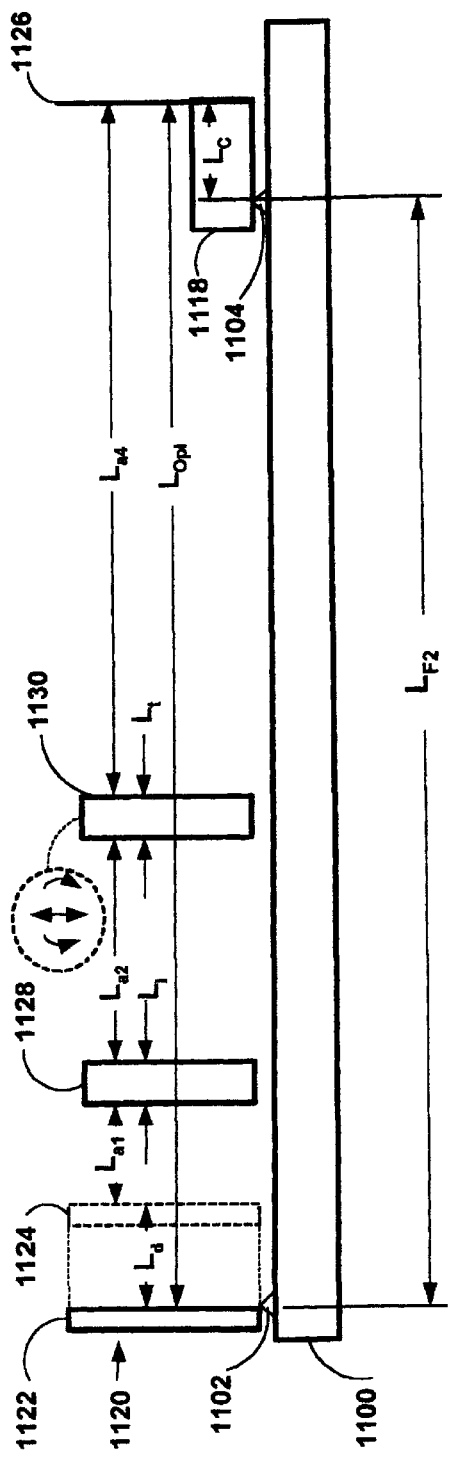

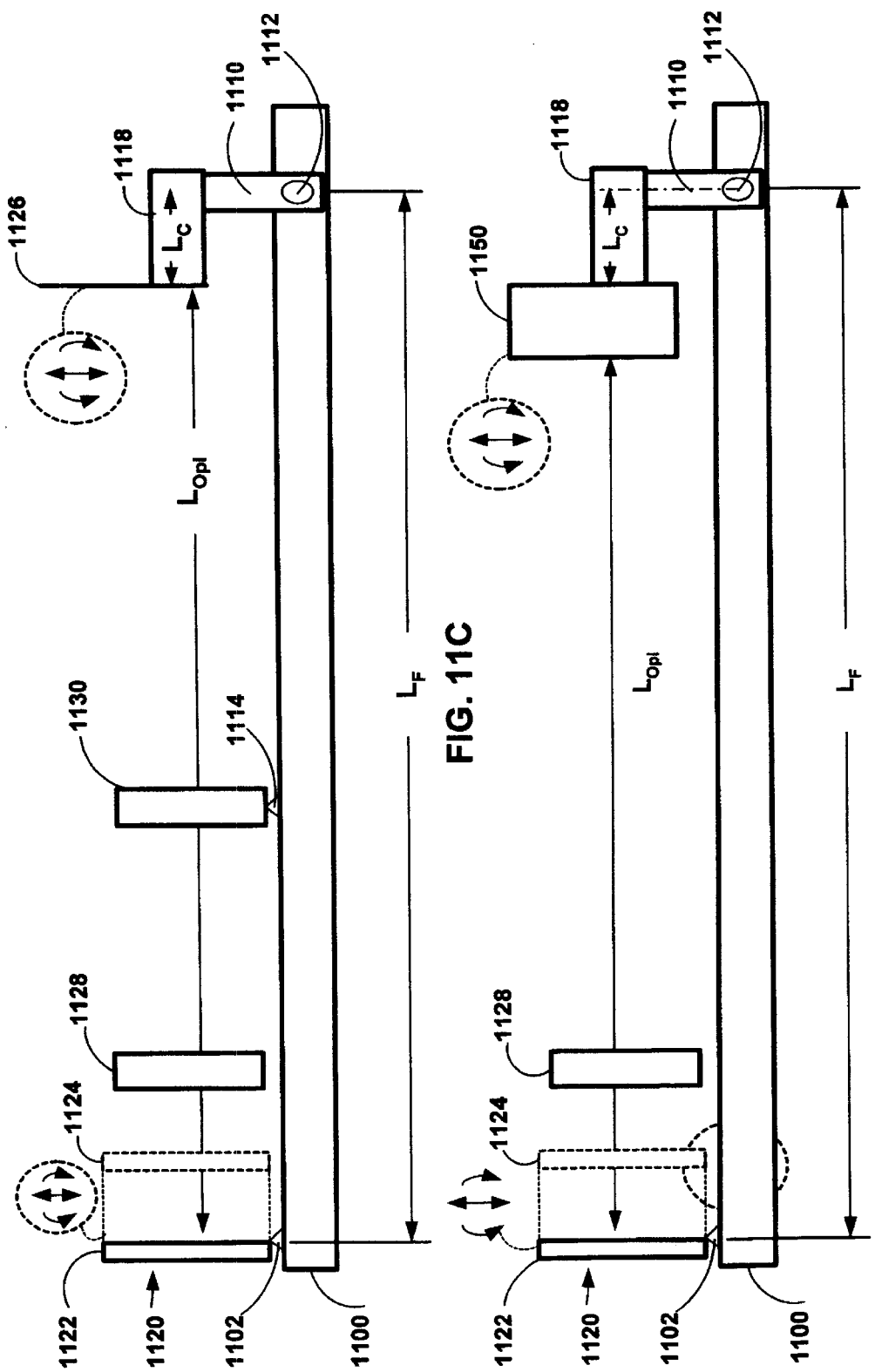

PASSIVE THERMAL STABILIZATION OF THE OPTICAL PATH LENGTH IN A TUNABLE LASER

CROSS-REFERENCE TO RELATED APPLICATION

This application claims priority from Provisional Application Number: 60/099,901, entitled "Modulation/Continuous Wave Constant Power Control Circuit"; No. 60/100,055, entitled "Drive Train Passive Thermal Compensation"; No. 60/099,839, entitled "Phase Continuous Tuning in An Extended Cavity Diode Laser Using Dispersion Compensation Together With Mechanical Grounding"; No. 60/099,865, entitled "Drive Train Flexure"; and No. 60/099,831, entitled "Passive Thermal Compensation of External Cavity Diode Laser", all filed Sep. 11, 1998. Each of the above-cited applications is incorporated herein by reference in its entirety.

BACKGROUND OF THE INVENTION

1. Field of the Invention

This invention generally relates to optical multimeters and more particularly to signal generating portions thereof.

2. Description of the Related Art

The telecommunications network serving the United States and the rest of the world is presently evolving from analog to digital transmission with ever increasing bandwidth requirements. Fiber optic cable has proved to be a valuable tool, replacing copper cable in nearly every application from large trunks to subscriber distribution plants. Fiber optic cable is capable of carrying much more information than copper with lower attenuation.

The T-1 standards committee ANSI has provided a draft document, "ANSI T1.105-1988", dated Mar. 10, 1988, which sets forth specifications for rate and format of signals which are to be used in optical interfaces. The provided specifications detail the Synchronous Optical Network (SONET) standard. SONET defines a hierarchy of multiplexing levels and standard protocols which allow efficient use of the wide bandwidth of fiber optic cable, while providing a means to merge lower level DSO and DS1 signals into a common medium. In essence, SONET established a uniform standardization transmission and signaling scheme, which provided a synchronous transmission format that is compatible with all current and anticipated signal hierarchies. Because of the nature of fiber optics, expansion of bandwidth is easily accomplished.

Currently this expansion of bandwidth is being accomplished by what is known as "wavelength division multiplexing" (WDM), in which separate subscriber/data sessions may be handled concurrently on a single optic fiber by means of modulation of each of those subscriber datastreams on different portions of the light spectrum. WDM is therefore the optical equivalent of frequency division multiplexing (FDM). Current implementations of WDM involve as many as 128 semiconductor lasers each lasing at a specific center frequency within the range of 1525–1575 nm. Each subscriber datastream is optically modulated onto the output beam of a corresponding semiconductor laser. The modulated information from each of the semiconductor lasers is combined onto a single optic fiber for transmission. The data structure of a basic SONET signal at a typical data rate of 51.84 Mbps, a.k.a. an STS-1 signal, has 9 rows of 90 columns of 8 bit bytes at 125 $\mu$s frame period. The first three columns of bytes in the SONET signal are termed the transport overhead (TOH) bytes that are used for various control purposes. The remaining 87 columns of bytes constitute the STS-1 synchronous payload envelope (SPE). As this digital signal is passed across a SONET network, it will be subject at various intervals to amplification by, for example, Erbium doped amplifiers and coherency correction by, for example, optical circulators with coupled Bragg filters. At each node in the network, e.g. central office or remote terminal, optical transceivers mounted on fiber line cards are provided. On the transmit side, a framer permits SONET framing, pointer generation and scrambling for transmission of data from a bank of lasers and associated drivers, with each laser radiating at a different wavelength. On the receive side, the incoming signals are detected by photodetectors separated into channels, framed and decoded.

As more and more optical signal equipment (transmitting, receiving, amplification, coherence and switching) is being designed and utilized, a need has arisen for optical multimeters, e.g. signal generators and detectors, which can be used to test the various components of an optical, e.g. SONET, network. What is needed is a tunable optical signal generator that does not require the complex control systems relied on by prior art devices. Those control systems utilize closed loop feedback of wavelength or position to select the output wavelength of the optical signal generator. As a result they are expensive and exhibit a large form factor.

SUMMARY OF THE INVENTION

The present invention provides an apparatus for passively stabilizing the optical pathlength in tunable lasers. Lasers stabilized using the passive stabilization apparatus exhibit reduced mode hop and increased wavelength stability during temperature variations of the laser or surrounding environment. The stabilization makes the laser suitable for a broad range of applications including optical signal generators and optical multimeters.

In an embodiment of the invention, a tunable laser with a base, a gain medium, a tunable feedback device and a first compensating element is disclosed. The gain medium and the tunable feedback device are coupled to the base. The tunable feedback device provides feedback of a selected wavelength to the gain medium. The first compensating element provides coupling to the base for at lease one of the gain medium and the tunable feedback device such that thermal expansion of the compensating element maintains a substantially constant integer number of half-wavelengths within a resonant cavity defined by the gain medium and the tunable feedback device during temperature variations in the tunable laser.

In another embodiment of the invention, a tunable laser with a base, a gain medium, a first and second feedback device, a pivot arm and a first compensating element is disclosed. The gain medium, and first and second feedback devices are coupled to the base. The first feedback device provides feedback of a selected wavelength to the gain medium. The pivot arm has a proximal and distal end. At the proximal end the pivot arm pivotally attaches to the base at a first pivot axis. The second feedback device couples to the distal end of said pivot arm to provide feedback of the selected wavelength to said first feedback device. The second feedback device together with the first feedback device and the gain medium define a resonant cavity. The second feedback device responds to the arcuate displacement of the pivot arm to vary the selected wavelength. The first compensating element couples the second feedback device to the distal end of said pivot arm such that thermal expansion of the first compensating element maintains a substantially constant integer number of half-wavelengths within the resonant cavity.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, wherein like reference numerals designate like structural elements, and in which:

FIGS. 11A–D are plan views of hardware associated with thermally stabilizing the optical pathlength of the laser cavity.

DETAILED DESCRIPTION OF THE INVENTION

The present invention provides an optical multimeter for use in calibrating and testing the various components associated with an optical network, e.g. SONET. The optical multimeter includes an analog/digital signal generator for delivering an optical output beam which can be modulated over a wide range of frequencies, duty cycles and amplitudes with very precise definition of the rising and falling edges of the waveform. Circuitry is also provided for modulation of an analog modulation signal onto the optical output. The signal generator includes a tunable laser that is thermally stabilized as to optical path length, as well as tuning angle of the tuning element. This substantially reduces thermally induced mode hops as well as thermally induced variations in the output wavelength. The tunable laser exhibits a small form factor due in part to a novel wavelength control process which utilizes an open loop system to maintain precise output wavelength control without the requirement of either a wavelength or position feedback device. Additionally, the tunable laser incorporates an inexpensive modulator circuit which combines a low frequency closed loop power control with a separate digital modulator. A novel mounting mechanism is disclosed which simplifies device fabrication by allowing precise positioning of optical and intermediate elements of the laser to a base.

Figure 1:
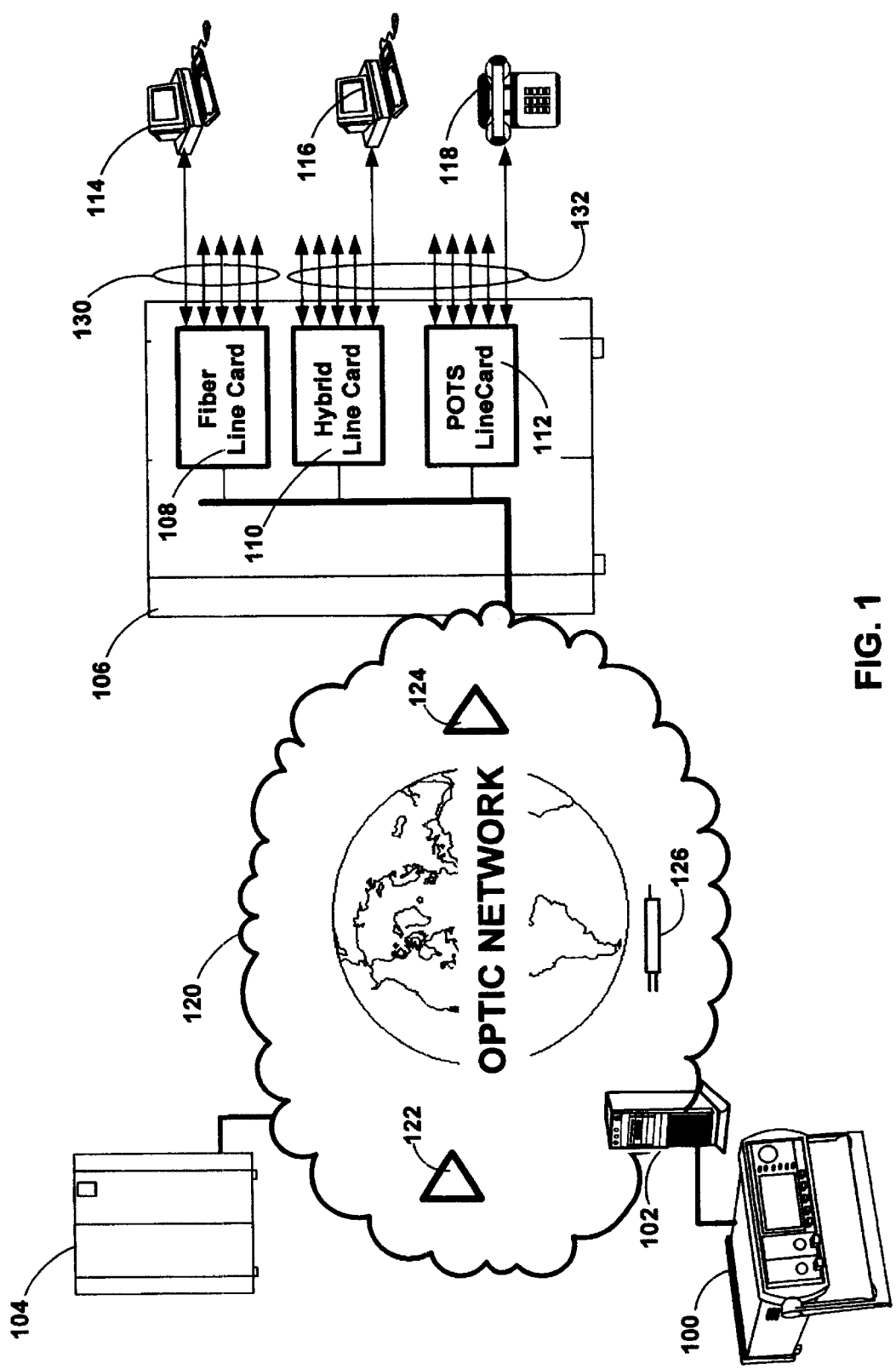
FIG. 1 shows an optical multimeter, according to the current invention, coupled to an optical network.

FIG. 1 shows an optical multimeter 100 coupled via a network access device 102 to the various components of an optical network 120. The Synchronous Optical Network (SONET) standard defines a networking approach for high speed data communication at data rates from 51.8 Mbps to 2.48 Gbps. With the implementation of SONET, communication carriers throughout the world can interconnect their existing digital carrier and fiber optic systems.

A plurality of central offices/switching centers 104–106 are shown coupled to an optical network 120. Datastreams are multiplexed using wavelength division multiplexing (WDM) in different portions of the optical spectrum. The network itself typically includes: Erbium doped line amplifiers 122–124 to maintain signal strength, circulators 126 with Bragg filters to maintain the coherence of the signals, and optical switches to route the traffic between appropriate data terminals. At the central office, the line cards 108–112 handle the transmission and reception of datastreams. On the transmit side, each line card includes semiconductor lasers each tuned to a specific wavelength within the range of 1525–1575 nm. Optical modulators inject datastreams into the output beams of these lasers which are collimated in a single fiber optic line for transmission across the network. On the receive side, each card includes photodetectors and demodulators to convert the received data into a format suitable for transmission across fiber subscriber lines 130 or copper subscriber lines 132 to data terminals 114–116 or to a traditional analog telephone 118. All of these components need to be tested and calibrated across a range of frequencies and power levels with signals that may be analog or digital. The high precision optical multimeter of the current invention includes a high precision optical signal generator and optical detector which allows these components to be tested on site or on the lab bench.

Figure 2:
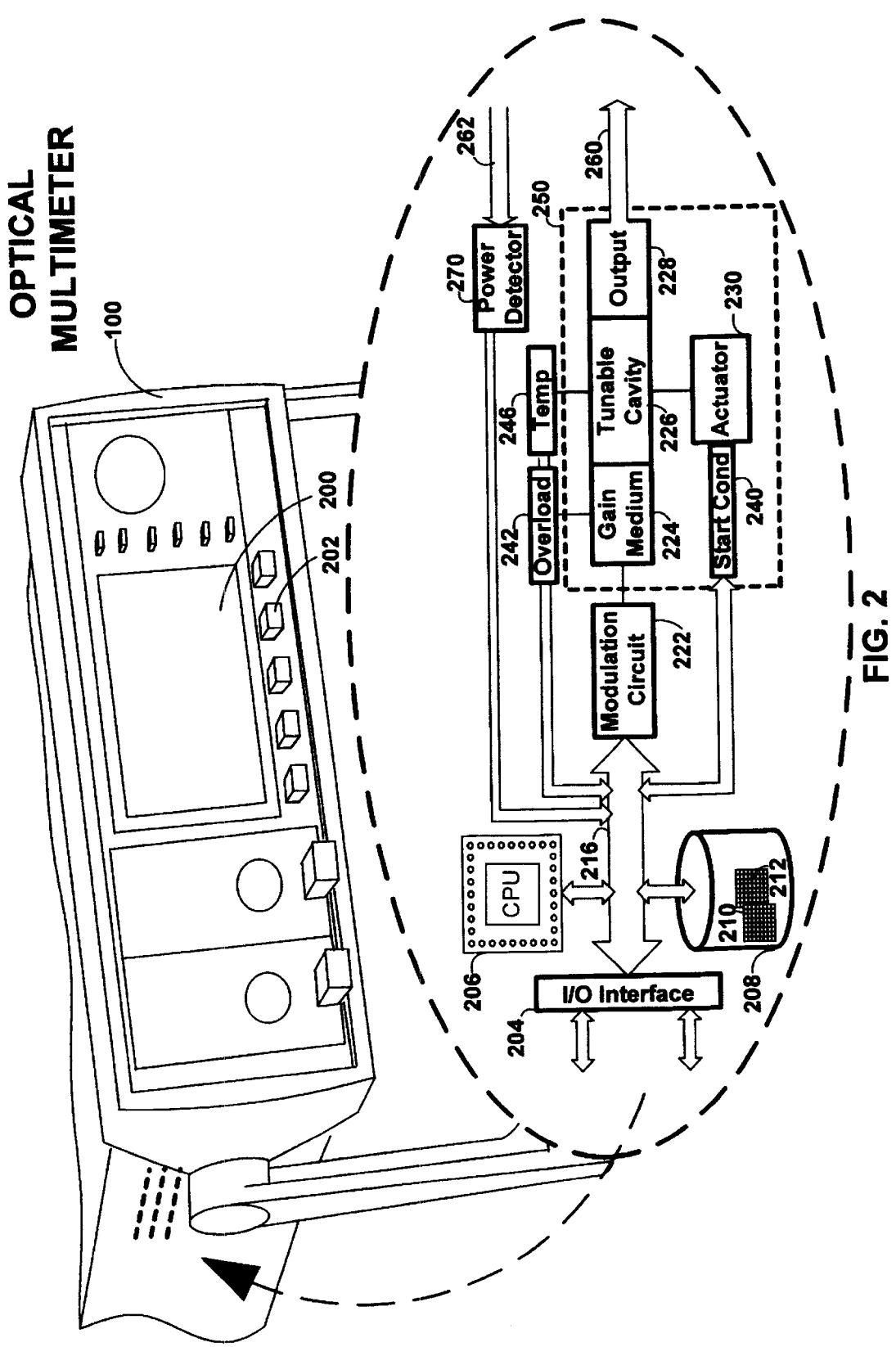
FIG. 2 is a hardware block diagram of an embodiment of the optical multimeter according to the current invention.

FIG. 2 shows an exterior isometric view of the optical multimeter housing as well as a hardware block diagram of the components within the optical multimeter. The optical multimeter 100 includes: display 200, user inputs 202, I/O interface 204, processor 206, memory 208, modulation circuit 222, overload sensor 242, temperature sensor 246, power-detector 270 and the signal generator 250. The signal generator includes: gain medium 224, tunable cavity 226, output 228, actuator 230 and start condition detector 240. The memory 208 includes program code 210 and lookup table 212.

The I/O interface couples the display 200 and user inputs 202 to the system bus 216. The memory 208 is coupled to the processor 206 and the system bus. The system bus also couples to the power detector 270, modulation circuit 222, start condition sensor 240, overload sensor 242, and temperature sensor 246. Within the signal generator the actuator 230 drives a tuning element within the tunable cavity 226. The start condition detector 240 couples either directly to the actuator or to the tunable element within the tunable cavity to detect a starting point thereof.

On the transmit side, the signal generator 250 generates an output beam 260. The output beam can be tuned to any of a number of center wavelengths associated with, for example, each channel in the IEEE-ITU standard. Selection of a center wavelength is accomplished by an open loop control system which utilizes the lookup table 212 to drive the actuator to the selected wavelength. Unlike prior art optical signal generators which require a continuous feedback across the tuning range of either position of the tuning element or wavelength of the output, no feedback is required to select output wavelength. Instead, an open loop control system is implemented, thus reducing the cost and form factor of the signal generator. To fabricate a precision tunable signal generator without either a wavelength feedback apparatus or position sensor, there must be a precise and repeatable correlation between the control signals supplied by the processor to the actuator 230 and the output wavelength 260. This in turn requires that the hardware be optically stable across a range of temperatures, where optical stability includes stability of both the optical pathlength as well as the tuning angle of the tuning element within the tunable cavity. Each signal generator includes processes for utilizing a unique lookup table, the records of which are generated during the manufacture of the device to correlate drive signals with output wavelength. This calibration involves ramping the tunable laser through a range of frequencies, and using a wavelength sensor, recording the correlation between output wavelength and the drive signals supplied to the actuator. This information is recorded in a wavelength_vs._drive signal lookup table 212 which is stored in memory 208 during the assembly of the device. Responsive to a user request for an output signal centered within a specific channel, the processor 206, using this table, generates the required number of actuator signals to tune the laser to the requested channel.

Environmental effects on laser output wavelength must be accounted for. Temperature is one of the primary environmental factors which affect output wavelength. The center wavelengths associated with neighboring channels are narrowly separated, i.e. less than 1 nm apart. These wavelength variations could easily be produced by thermal expansion/contraction of the tuning mechanism for the tunable cavity 226 or by variations in the optical pathlength. Two techniques may be used singly or in combination to substantially reduce the effect of temperature variations on the wavelength stability/accuracy of the output beam. One technique involves actively adding or removing energy from the cavity to maintain a constant thermal state, thus avoiding thermal contraction and expansion by stabilizing the temperature in the tunable cavity. The other involves fabricating the tunable laser in a manner which allows thermal expansion and contraction without, however, inducing temperature-related variation in the output wavelength from the tunable laser. Although either approach is suitable for use with the current invention, the latter passive approach set forth in FIGS. 11–14, has the advantage of lower cost and form factor since no thermal generator, monitor, and control circuitry is required.

In operation, the optical multimeter may be used singly or in combination with other multimeters to test optical devices on the bench or across a network connection. One method for testing an optical device involves coupling the multimeter output beam 260 to a device under test (DUT) and monitoring the DUT output 262 at the power detector 270. For a DUT such as an Erbium doped optical amplifier, the output signal 260 can be injected into the optical amplifier, and the resultant output 262 signal from the amplifier may be coupled to the receive side of the optical multimeter. On the receive side, an optical signal 262 received via power detector 270 is digitally sampled and passed to the processor via system bus 212. The processor executing program code 210 stored in memory 208 analyzes the received signal according to parameters input by the user on input 202. Additionally, the processor passes the signal via I/O interface 204 for presentment to the user on display 200. Because the output signal 260 is precisely controlled, the processor 206 may compare the received signal with the known parameters of the transmitted signal in order to characterize various parameters of the DUT such as: power level, gain, rise and fall time, etc.

In an alternate embodiment of the invention both the signal generator and the power detector as well as other modules would each implement plug-and-play technology with dedicated master processor resident in the multimeter mainframe.

Figure 3:
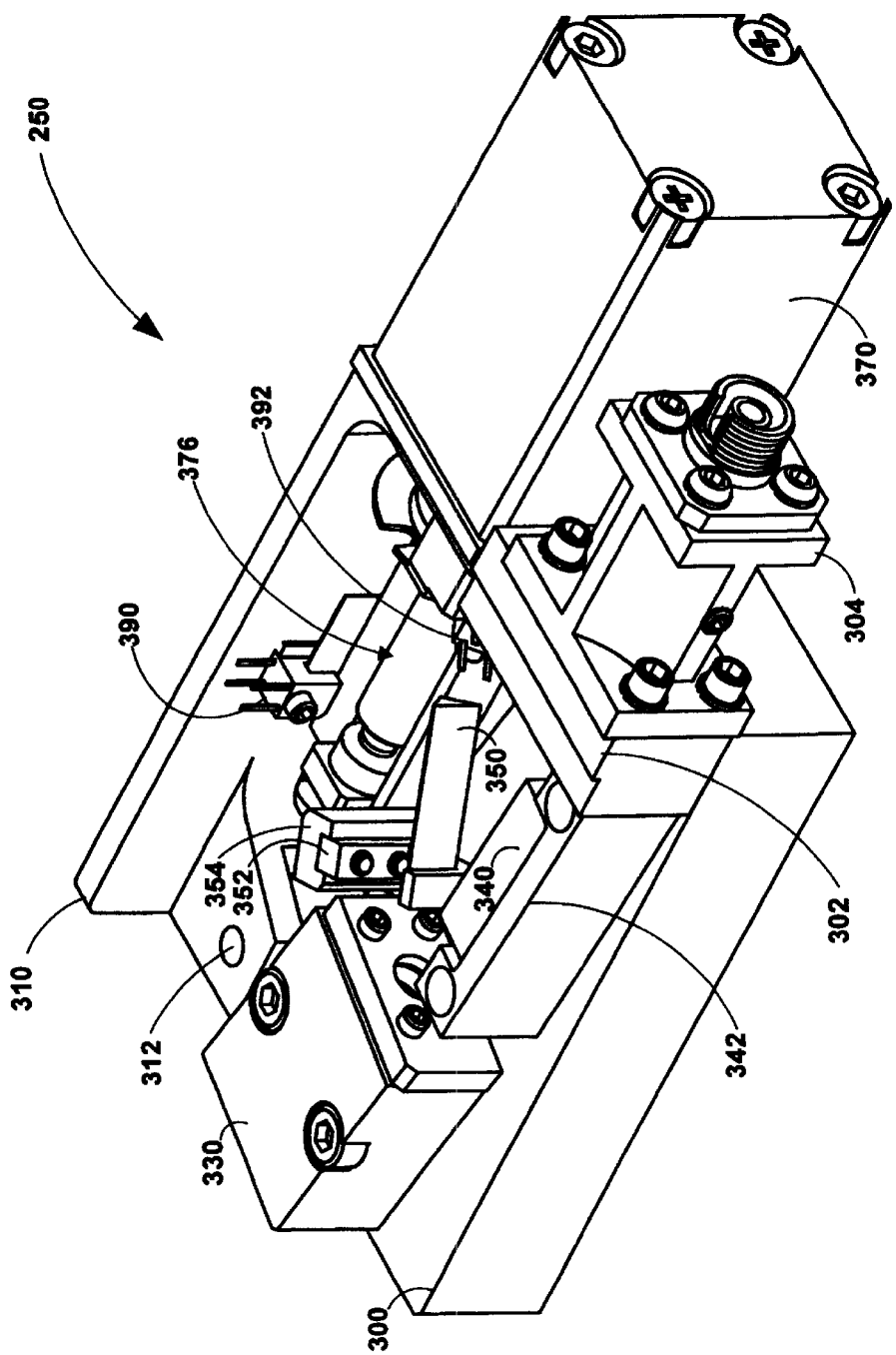
FIG. 3 is an isometric view of the signal generator portion of the optical multimeter shown in FIG. 2 which incorporates a tunable laser.

FIG. 3 as an isometric view of a hardware embodiment of the signal generator 250 shown in FIG. 2. The base 300, fiber mount 302, fiber coupling 304, motor bracket 310, laser diode housing 330, diffraction grating 340, grating mount 342, retroreflector 350, compensating element 352, pivot bracket 354, actuator 370, drive train 376 and start condition sensors 390-392 are shown. In an embodiment of the invention the signal generator incorporates a tunable laser in a Littman-Metcalf configuration. In this configuration, the laser diode within housing 330, the diffraction grating 340 and the retroreflector 350 are laid out in a generally triangular arrangement. The laser housing 330 is affixed to base 300 at a grazing angle with respect to the diffraction grating 340, such that a reflection from the diffraction grating passes to the fiber coupling 304 where it is coupled to a fiber optic (not shown). The diffraction grating is coupled to the grating mount 342, which is in turn fastened to the base 300. The fiber coupling 304 is fastened to the fiber mount 302, which is in turn coupled to base 300. The laser beam is also diffracted from the diffraction grating 340 striking the retroreflector 350. The return beam from the retroreflector strikes the diffraction grating and returns through an antireflective coating on the front facet of the laser diode within housing 330 to select the output wavelength of the laser. The retroreflector 350 is coupled to a compensating element 352, which is in turn coupled to the pivot bracket 354. The pivot bracket is coupled to the base 300 at a pivot point which allows tuning of the laser by combined rotation and translation of the retroreflector with respect to the diffraction grating (See FIGS. 5–6). The pivot point may be selected to provide the requisite combination of rotation and translation so as to maintain a constant integer number of half-wavelengths in the cavity, thus reducing mode hopping. This pivot point may be selected in accordance with the teachings of U.S. Pat. No. 5,319,668, issued on Jun. 7, 1994, entitled "Tuning system for External Cavity Diode Laser" and having in common with the current invention the Assignee New Focus Inc., of Santa Clara, Calif.

In an embodiment of the invention, a pivot bracket and attached retroreflector is used to tune the laser. The motion of the pivot bracket is brought about by a linear translation of the drive train 376 coupled to a pivot arm to which the pivot bracket is attached. The motion of the pivot arm results from the actuator 370. The actuator 370 is coupled to the motor bracket 310, which is in turn coupled via a fastener placed within coupling 312 to the base 300. In this embodiment of the invention, the actuator is a rotary stepper motor. Other actuators may be used with equal advantage, including, but not limited to: linear stepper motors, piezo-electric stacks, bimetallic elements, AC/DC motors, etc. As will be obvious to those skilled in the art, the actuator 370 could be bolted directly to the base 300 without departing from the scope of the invention. The stepper motor operates under control of the processor 206 (See FIG. 2). In an embodiment of the invention, start condition sensors 390–392 are used to determine a starting position for the drive train by making a linear and arcuate readout of the drive train. These sensors, in combination with the wavelength lookup table 212, allow the processor to control the actuator so as to select output wavelengths for the tunable laser (See FIG. 9).

Figure 4:
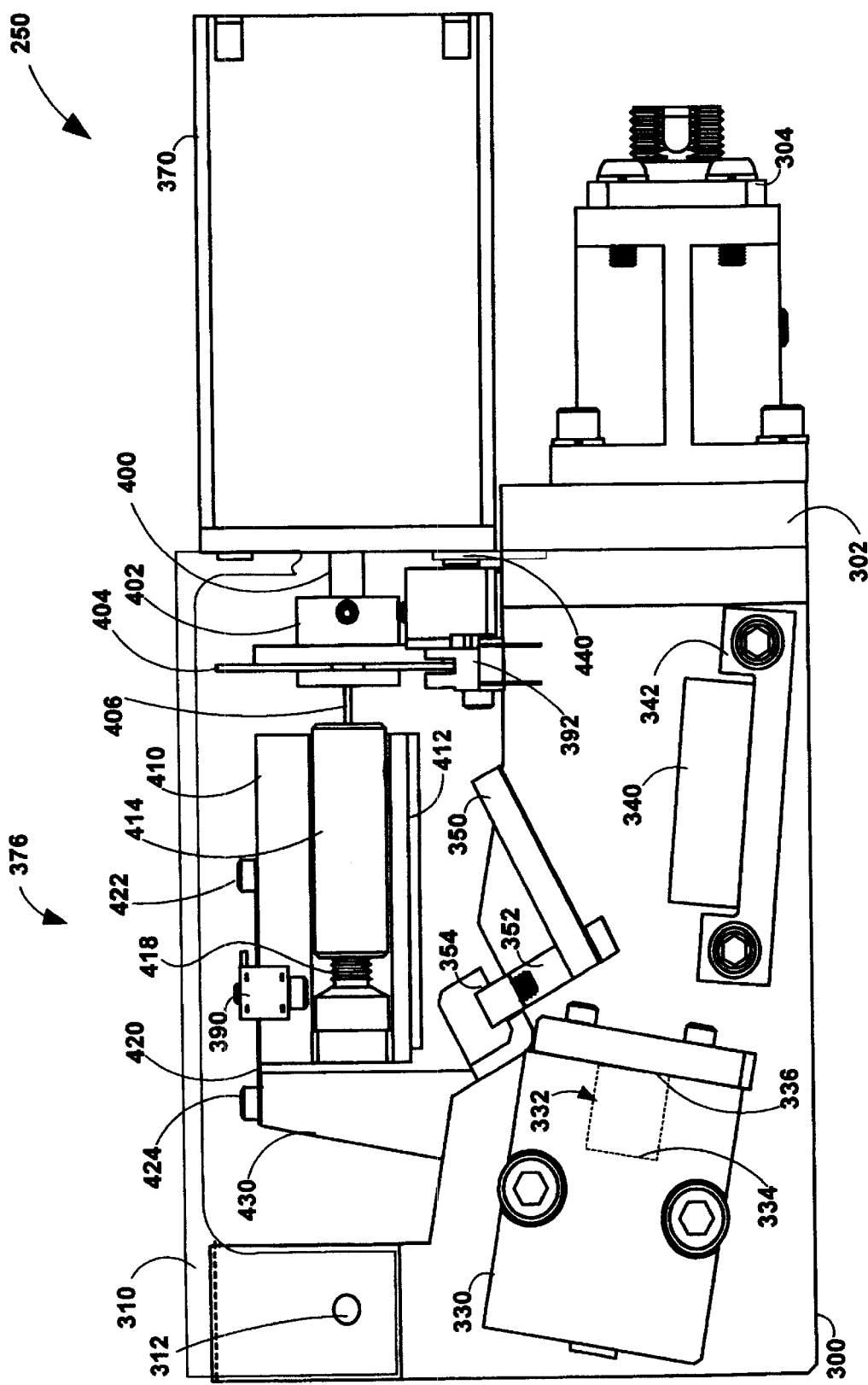
FIG. 4 is a top plan view of the tunable laser shown in FIG. 3.

FIG. 4 shows a top plan view of the tunable laser embodiment shown in FIG. 3. The base 300 with attached laser diode housing 330, diffraction grating 340, and fiber coupling 304 is shown. The actuator 370 is coupled to the base 300 via motor bracket 310 and strap 440. The individual components of the drive train 376 are visible and include: drive shaft 400, hub and rim 402-404, rotary flex member 406, compensating element 410, translation unit 412, cylindrical nut 414, lead screw 418, and linear flex member 420.

The drive train 376 comprises rotary, linear, and arcuate portions. Generally the drive shaft converts the rotary motion of shaft 400 to linear movement of compensating block 410 and finally to arcuate movement of the tip 430 of the pivot arm to which the bracket 354 and associated retroreflector 350 are attached (See FIG. 5). This provides for the tuning of the output beam of the laser.

The rotary portion of the drive train includes: shaft 400, rim 404, rotary flex member 406 and cylindrical nut 414. In the embodiment shown, the actuator 370 is a rotary actuator and specifically a stepper motor. As will be obvious to those skilled in the art, suitable alternate actuators include: piezoelectric stacks, AC/DC motors, linear stepper motors, etc. The output shaft 400 of the stepper motor is coupled via the hub and rim 402-404 to the rotary flex member 406, which is in turn coupled to the cylindrical nut 414. The cylindrical nut includes a threaded interior portion. The rotary flex member 406 is placed intermediate the cylindrical nut and the drive shaft 400 in order to de-couple the cylindrical nut from any misalignments of the stepper motor shaft 400. These misalignments can arise, for example, due to non-parallelism between the axes of the lead-screw assembly and motor, or run-out and wobble in the motor-shaft, nut and screw. The rotary flex member is relatively compliant in all directions except longitudinally. The torsional compliance of the driveshaft introduces hysteresis into the system. This is overcome by driving the motor to approach all target positions from the same direction. In this way the "wind-up" of the driveshaft becomes a constant, rather than a variable. The rim 404 passes through the start condition optical switch 392 and is encoded (See FIG. 9), so as to allow the switch to sense an arcuate starting point for the actuator shaft. After registering that starting location during the initialization of the signal generator, no further detection is required for the switch(s).

Figure 13A:
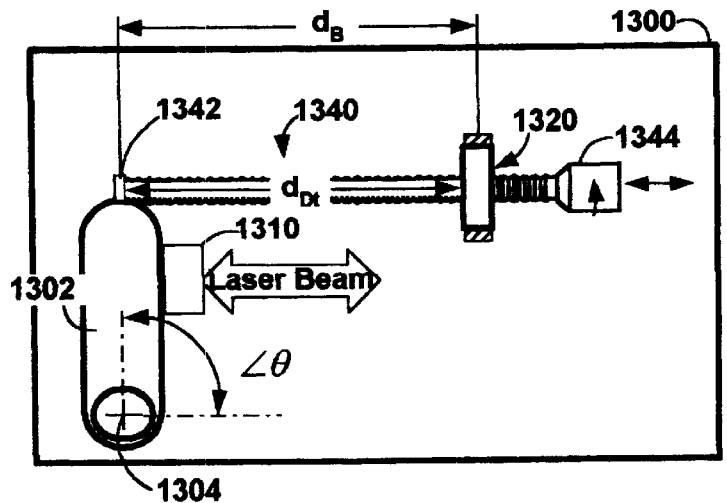
FIG. 13A is a top plan view of a prior art drive train for mechanically activating the tuning element of a tunable laser.
Figure 13B:
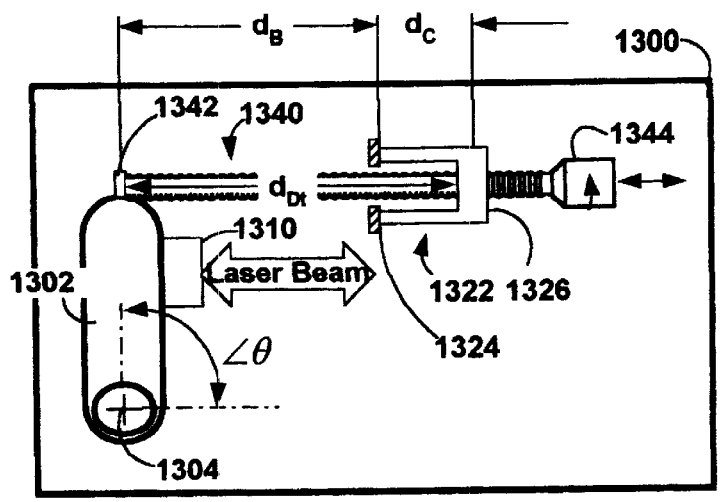
FIGS. 13B–D are top plan views of alternate embodiments of hardware for thermally stabilizing the tuning element of a mechanically tuned laser in accordance with an embodiment of the current invention.
Figure 13C:
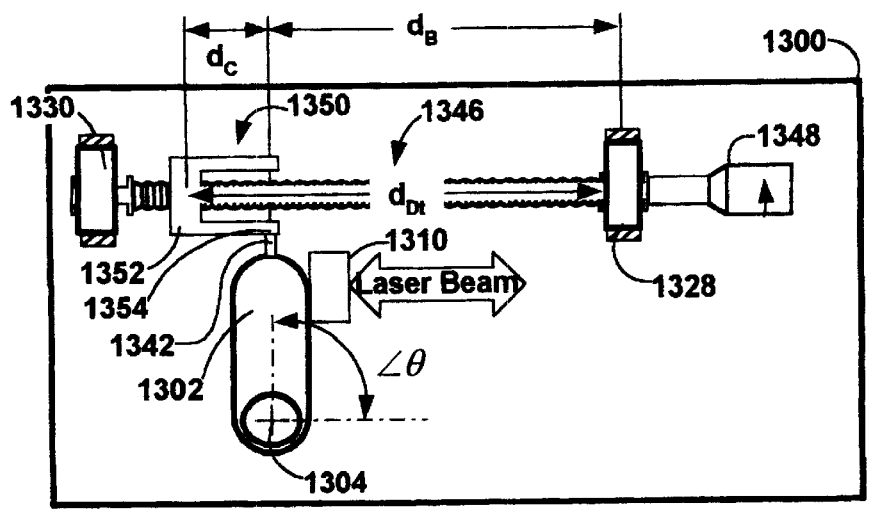

The linear portion of the drive train includes translation unit 412, compensating element 410, and lead screw 418. The lead screw 418 includes a threaded portion which engages the interior threaded portion of the cylindrical nut. The head of the cylindrical nut is coupled to the distal end of the compensating element 410. The compensating element 410 is in turn coupled to the linear translation unit 412. The linear translation unit 412 is coupled to the motor bracket 310. Thus, rotation of the stepper motor shaft 400 results in a linear movement of the lead screw 418 toward, or away from, the cylindrical nut with which it is threadably engaged. The movement of the lead screw is linearized with respect to the base by means of the attachment of the nut to the base via the compensating element 410 and translation unit 412. As will be obvious to those skilled in the art, the placement of the lead screw and nut could be reversed without departing from the scope of the invention. In that alternate embodiment of the invention, the rotary member would have an external thread, i.e. lead screw, and the cylindrical nut would be attached to the compensating element. In still another embodiment of the invention, the linearization of the lead screw and compensating element could be achieved by the positioning of the head of the lead screw within a complementary opening of the base, thereby linearizing the motion of the lead screw with respect to the base. In an alternate embodiment of the invention the lead screw is rotationally driven and axially constrained as shown in FIGS. 13B–C.

The arcuate portion of the drive train includes the linear flex member 420, fasteners 422–424, and the tip 430 of the pivot arm. In the embodiment shown, the flex member 420 is a spring metal strip, the cross-sectional profile of which is rectangular. In alternate embodiments of the invention, the linear flex member may include square or round, cross-sectional profiles. The linear flex member allows conversion of the linear motion of the compensating element into an arcuate motion of the tip 430. In an alternate embodiment, the linear flex member comprises part of the tip 430 of the pivot arm.

Figure 5:
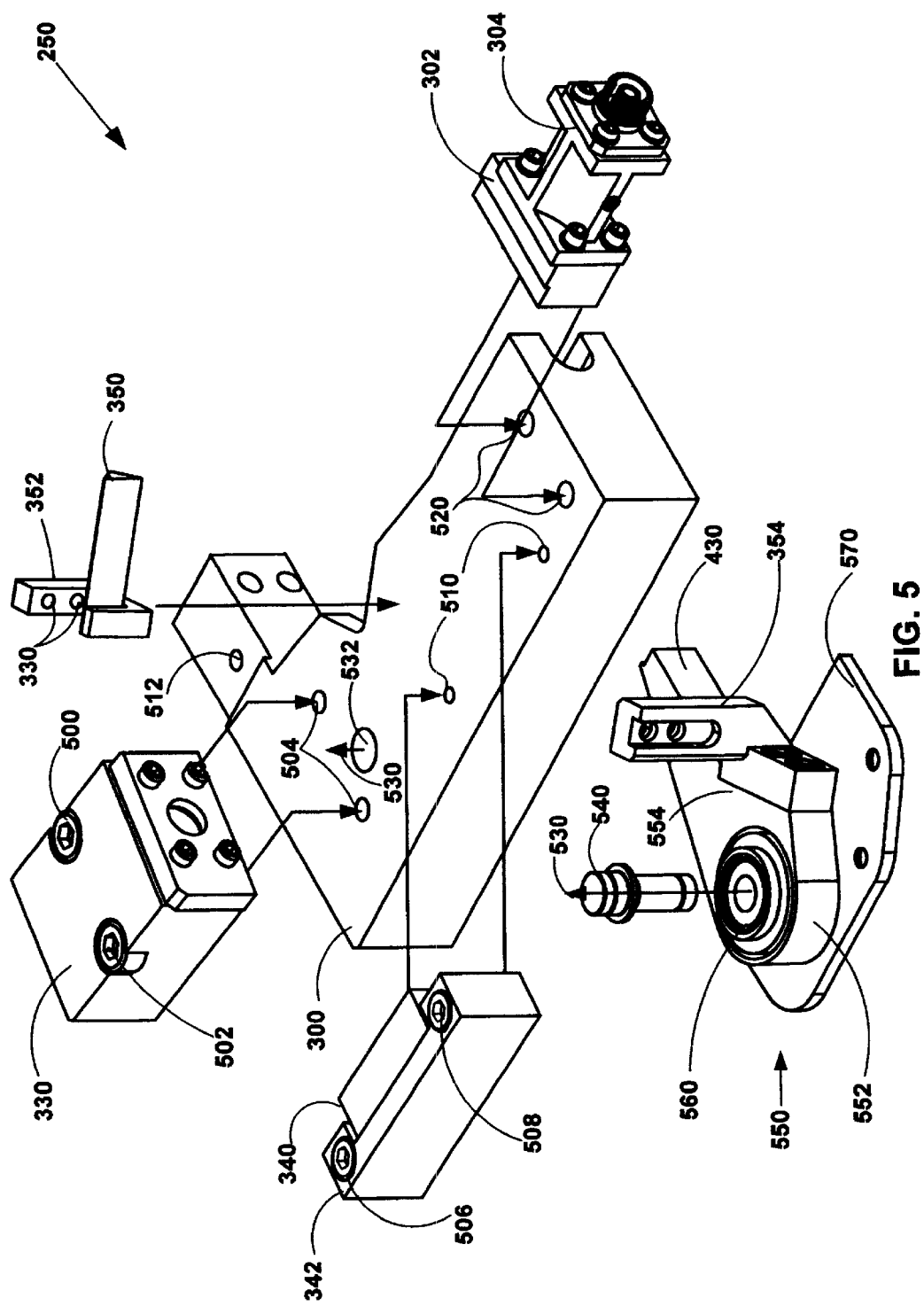
FIG. 5 is an exploded isometric view of a tunable laser shown in FIGS. 2–4.

FIG. 5 is an exploded isometric view of the tunable laser shown in FIGS. 3–4, in which the actuator and drive train assembly have been omitted. The relationship of the primary components of the tunable laser to a common base or ground plane is shown. The laser diode housing 330 couples to mounting holes 504 within base 300 via fasteners 500–502. The diffraction grating 340 couples to the mount 342. This coupling may be by means of an adhesive fastener, soldered, welded or integral with the base. The mount 342 couples to mounting holes 510 within base 300 via fasteners 506–508. The pivot member 550 is rotatably coupled to the base 300 at thru-hole 532, the center of which is aligned with the pivot axis 530. In a preferred embodiment of the invention, the pivot axis location with respect to the laser diode, diffraction grating and retroflector is determined in accordance with the teachings embodied in the '668 Patent. Significantly, the pivot point location takes into account the effect of the dispersion of the laser and other optical elements in the system on the cavity length. This pivot point is selected so as to provide an internal cavity length (See FIGS. 11–12)

which is substantially a constant integer number of half-wavelengths throughout all wavelengths within the tuning range. Bearing post 540 is fit into the thru-hole from the bottom side of the base 300. The base portion 552 of the pivot member 550 includes a cylindrical bearing 560. The bearing is fit over the post on the bottom of the base 300, thereby providing precise rotation of the pivot member in a plane parallel to the lower surface of the base plate 300. Attached to an intermediate portion 554 of the pivot member is the above-mentioned pivot bracket 354. This extends from the bottom of the base to an exposed position on the top side of the base. The pivot member 550 is secured to the lower portion of the base 300 via mounting plate 570 and fastening members (not shown). In the assembled position (See FIG. 6), the compensating element 352 and retroreflector 350 are coupled to the pivot bracket from the top side of the base 300. The fiber coupling 304 and fiber mount 302 are fastened to the base via fasteners (not shown) positioned within mounting holes 520 defined within the base.

An advantage to the embodiment of the tunable laser shown in FIGS. 3–5 is that all components are coupled to a common base. Consistent with the teachings on the current invention, the locations of each of the components can be precisely calculated. Thus, as is the case in the prior art, it is not necessary that adjustment features be provided for any of the components. Instead, the laser diode, diffraction grating, and retroreflector are either absolutely or rotatably fixed to a common base, thereby greatly improving the stability of the output signals generated by the tunable laser. In alternate embodiments of the invention, the apparatus for coupling the pivot member 550 to the base includes: rotary bearing, needle bearing, journal bearings, flexural bearings, rotary flexural bearings, etc.

Figure 6:
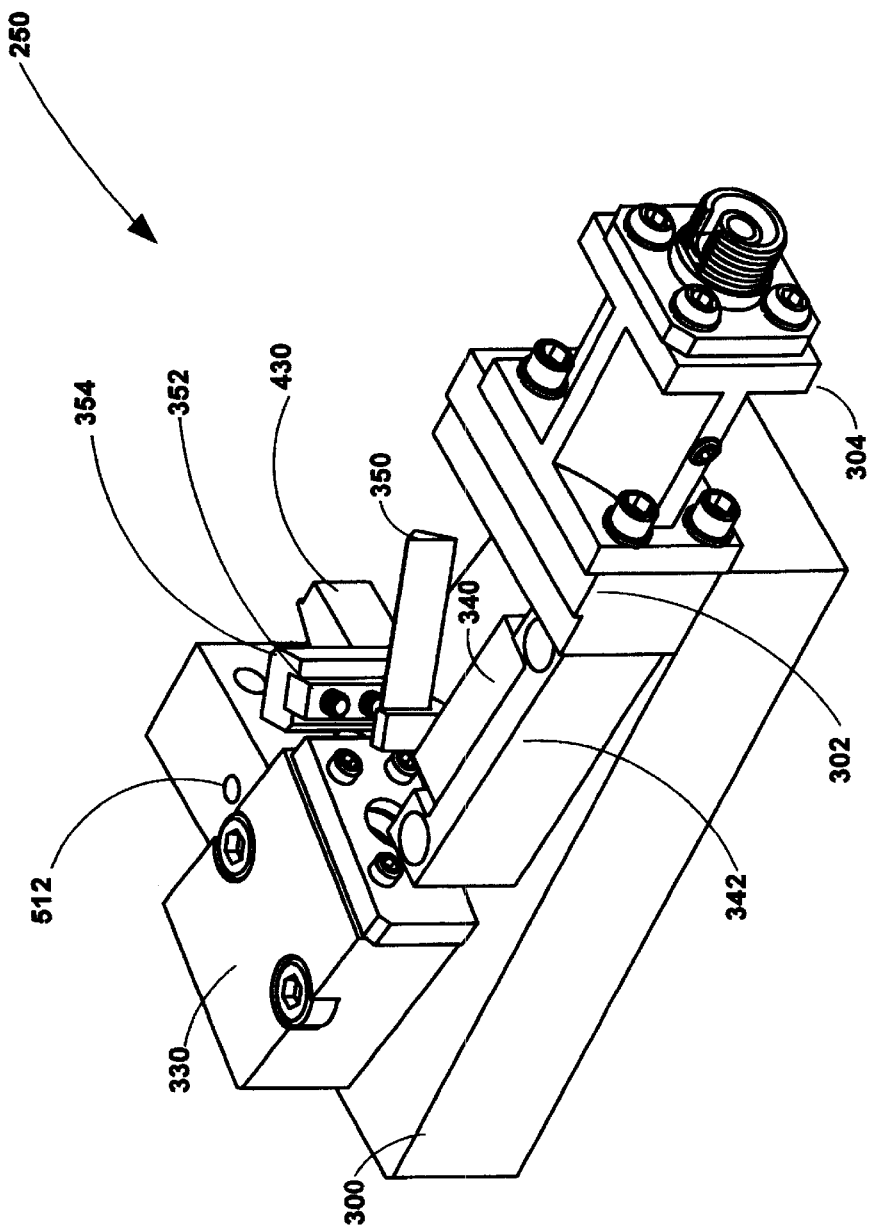
FIG. 6 is an assembled view of the tunable laser shown in FIG. 5.

FIG. 6 is an assembly isometric view of the tunable laser shown in FIG. 5 in which the actuator and drive train assembly have been omitted. The laser diode housing 330, diffraction grating 340, and fiber coupling 304 are shown coupled to the base 300. The pivot bracket 354 extends partially above the top surface of base 300. The proximal end of the compensating element 352 is attached to the pivot bracket by fasteners (not referenced). The retroreflector 350 is coupled to the distal end of the compensating element. In the embodiment shown the retroreflector is fastened by means of an adhesive, solder, weld, etc. Finally, the tip 430 of the pivot member 550 is shown beneath the top of the base and extends into the upper portion of the base in which the drive train assembly will be located.

Figure 7:
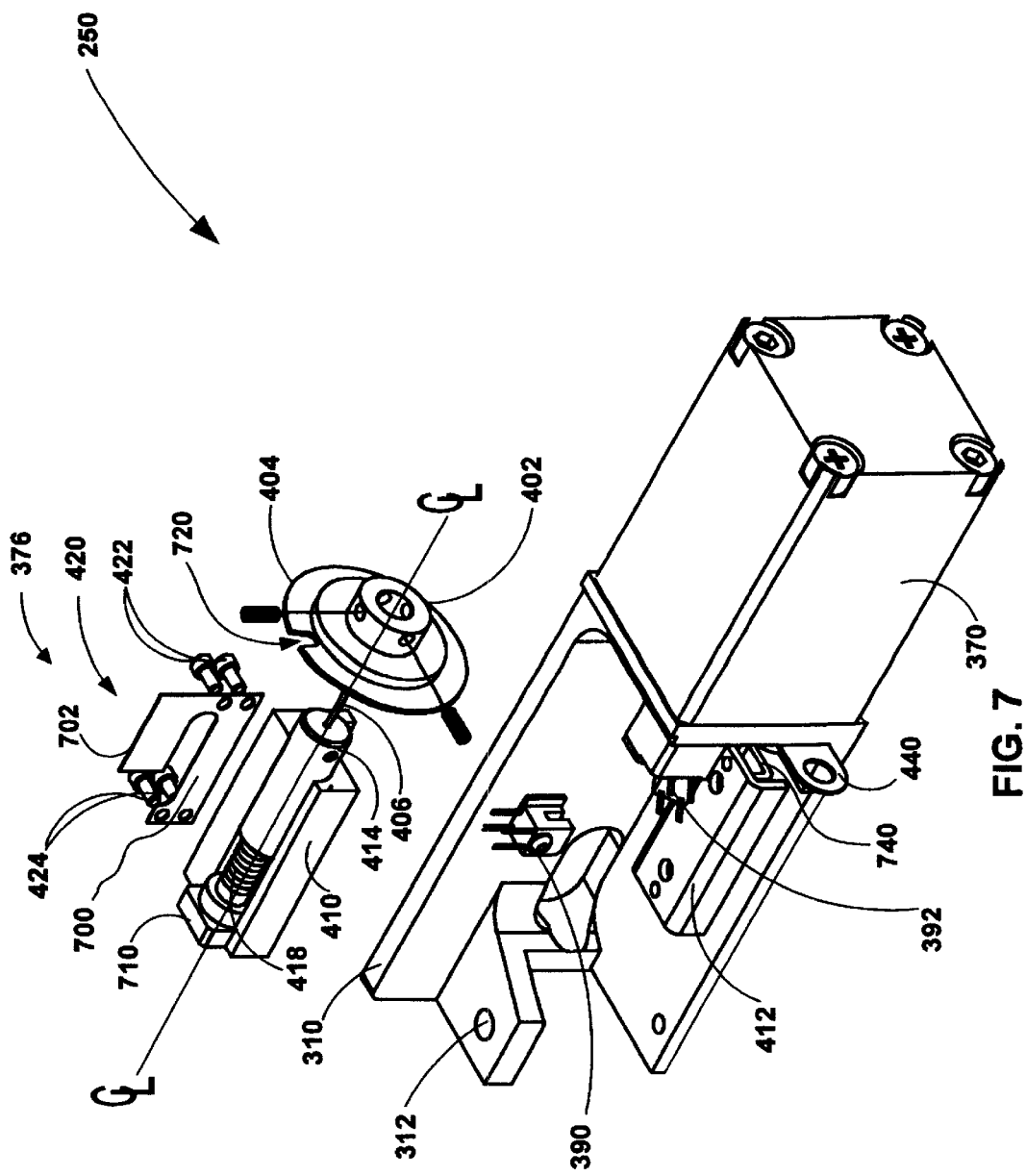
FIG. 7 is an exploded isometric view of the drive portion of the tunable laser shown in FIGS. 3–4.

FIG. 7 is an exploded isometric view of the drive train portion of the tunable laser shown in FIGS. 3–4. Specifically, the rotary and linear portions of the drive train are shown with the arcuate portion omitted. The actuator 370, motor bracket 310, start condition detectors 390–392, and drive train assembly 376 are shown. In the exploded view, the linear translator 412 is shown with a lower portion 740 coupled to the base of the motor bracket 310 in an orientation which provides for linear movement along the longitudinal axis defined by the drive assembly of the linear translator. This axis, as will be discussed in the following FIG. 13, is generally tangent to the arc swept out by the tip of the pivot arm. The start condition detectors 390–392 shown coupled to the motor bracket. The strap 440 and mounting holes 312 provide two fastening points by which the drive assembly and actuator are rigidly coupled to the base 300. In an alternate embodiment of the invention, the actuator and translation unit may be directly coupled to the base 300. The rotary portion of the drive assembly 376 includes the actuator shaft (not shown), hub 402, rim 404, rotary flex member 406 and cylindrical nut 414. A notch 720 on the rim 404 is shown. When assembled, the rim rotates within opposing arms of the rotary start condition sensor 392, that notch is optically detected, thereby accurately gauging an arcuate starting position of the actuator 370.

The lead screw 418 threadably couples at a proximal end to the interior threaded portion of the cylindrical nut 414. Thus, as the cylindrical nut is rotated by the actuator, the lead screw is retracted or extended within the cylindrical nut. The lead screw is affixed at a distal end to a distal end 710 of the compensating element 410. The attachment of the compensating element to a translation unit 412 both linearizes the movement of the compensating element, as well as prevents the rotation of the lead screw. This limits the lead screw and compensating element to the desired linear motion along the longitudinal drive axis.

The linear flex member 420 is a strip of spring metal generally rectangular in cross-section and with lower and upper portions 700–702, respectively. At a proximal end, the lower portion is attached via fasteners 422 to the compensating element 410. The point of attachment is precisely determined at a distance from the distal end 710 of the compensating element. At a distal end the flex member is coupled via fasteners 424 to the tip 430 (not shown) of the pivot member 550 (See FIG. 5). The thermal expansion of the compensating element is calculated so as to thermally pacify the drive assembly and prevent steady state motion of the pivot arm 550 and retroreflector (See FIG. 13) as a result of temperature variations.

Figure 8:
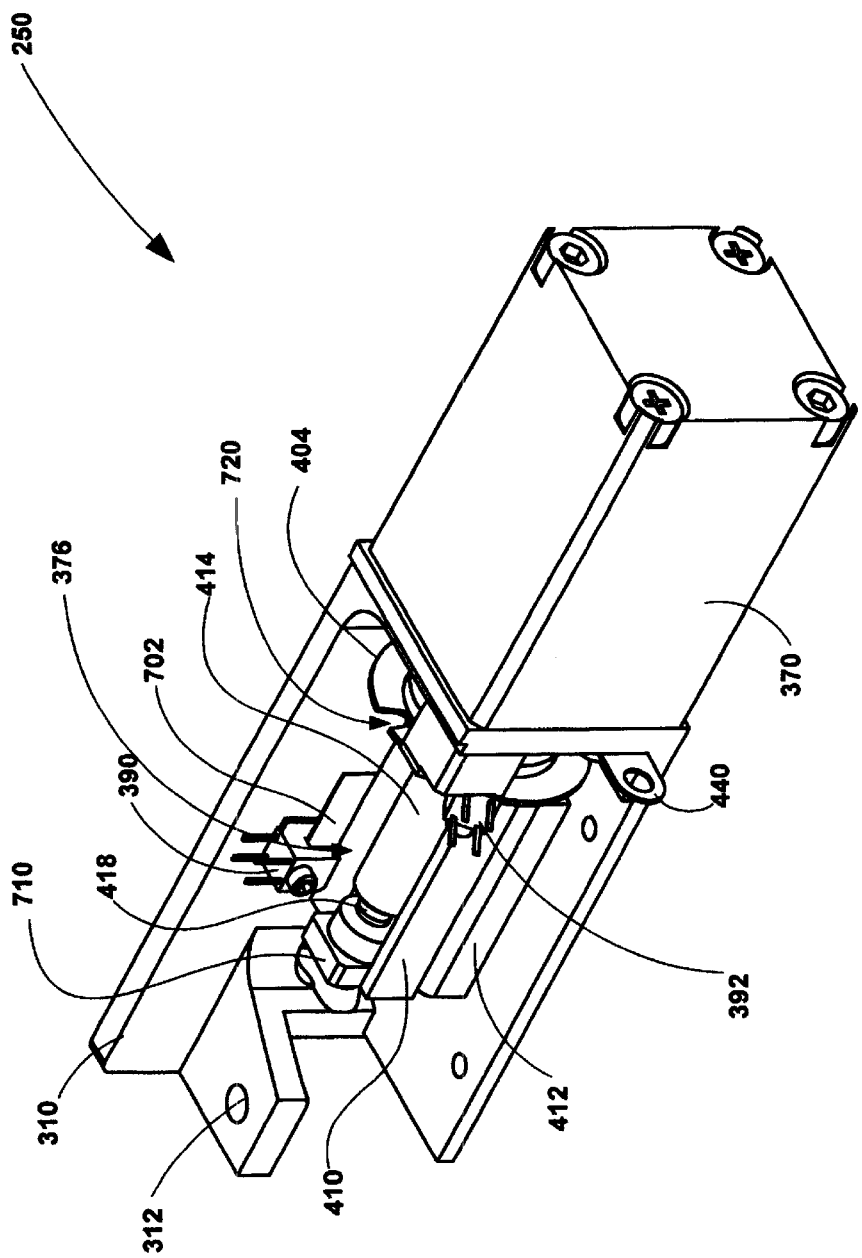
FIG. 8 is an assembled view of the drive portion of the laser shown in FIG. 7.

FIG. 8 is an assembled view of the drive assembly 376, motor bracket 310 and actuator 370 shown in FIG. 7. The drive assembly is shown attached to the actuator. The rim 404 is positioned within start condition detector 392 to detect rotational orientation of the actuator. The compensating element 410 is fastened to the linear translator 412, which is in turn coupled to the motor bracket 310. The compensating element is constrained to linear motion with respect to the base along a line tangent to the arc swept by the tip of the pivot arm 550 (See FIG. 5) during tuning of the laser. The upper portion 702 of the linear flex member 420 is positioned within start condition sensor 390 such that the start position of the compensating element may be detected.

Figure 9:
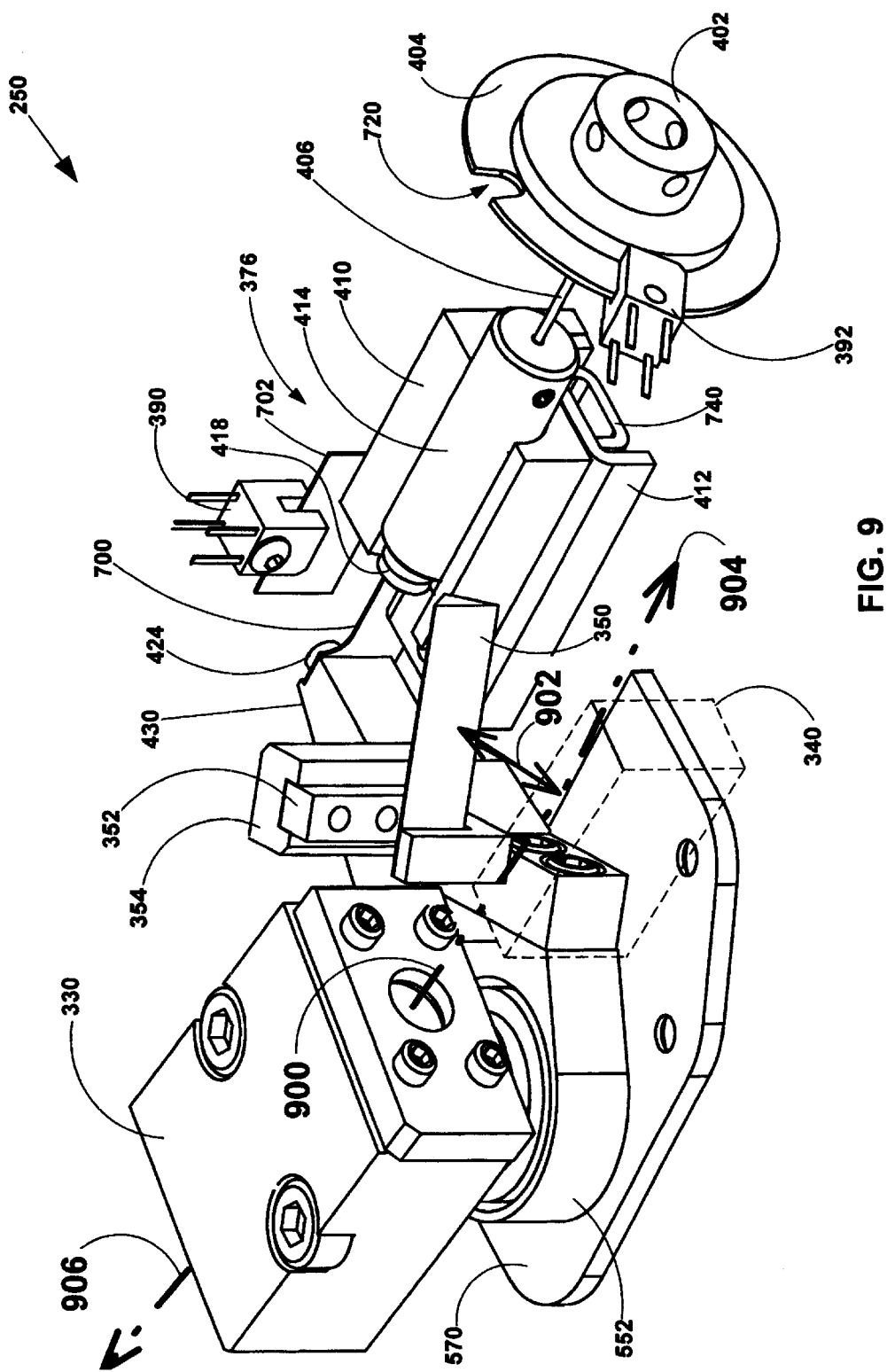
FIG. 9 is an isometric view showing the laser and actuator portions of the tunable laser shown in FIGS. 3–4.

FIG. 9 is an assembly view of the embodiment of the tunable laser discussed above in connection with FIGS. 3–8. The base 300, actuator 370 and motor bracket 310 are not shown. The laser diode housing 330 is positioned above the base 552 of the pivot arm. The pivot bracket, located at an intermediate portion of the pivot arm, is shown with the retroreflector 350 attached thereto via the compensating element 352. The retroreflector 350 is caused to undergo a combination of rotation and translation with respect to the diffraction grating 340 (shown in phantom view) by means of arcuate motion of the tip 430 of the pivot arm. The distal portion of the lead screw 418 (See FIG. 4) and compensating element 410 have been removed in order to view the lower portion 700 of the flex member. The lower portion of the linear flex member is coupled via fasteners 424 to the tip 430 of the pivot arm. The upper portion 702 of the linear flex member is shown positioned within the linear start condition detector 390. Rotation of the drive shaft of the actuator results in rotation of the cylindrical nut 410. This results in linear movement of the lead screw and the compensating element to which it is attached. This linear motion in turn arcuately displaces the pivot arm through the coupling of the tip of that arm to the compensating element via the linear flex member. The linear flex member is sufficiently rigid so as to overcome any friction in the pivot arm bearing 560

(See FIG. 5), thus assuring that for each unique linear displacement of the compensating element, a unique pivot arm angle is also defined. This retroreflector coupled to the pivot arm is thereby caused to undergo both rotation and translation with respect to the diffraction grating.

In operation, a laser diode within housing 330 emits a beam 900 through the front facet which intersects at a grazing angle the diffraction grating 340. The diffracted beam 902 from the grating strikes the retroreflector 350. A portion of the diffracted beam having a specific wavelength determined by the orientation of the retroreflector with respect to the grating is reflected back to the grating and injected back into the laser diode, thus selecting a cavity mode that supports the desired output wavelength. The reflection 904 of the laser beam from the diffraction grating provides a potential source for the optical output 260 (See FIG. 2) of the signal generator of which the tunable laser is a part. An alternate output signal source is provided by beam 906 from the back facet of the laser. This optional beam results when the back facet of the laser diode is partially transmissive.

Output Wavelength Determination

In order for the tunable laser to be controlled with an open loop system, which does not require closed loop feedback of, for example, wavelength or position, several requirements must be met in embodiments of the invention in which the laser is mechanically tuned. First, the actuator which drives the tuning element must be capable of incrementally moving the tuning element, e.g. retroreflector, diffraction grating, etalon, etc., from one position to the next across the tuning range so that narrowly separated center wavelengths can be selected. Second, there must be some way of correlating control/activation signals supplied to the actuator with output wavelength. Third, in the absence of wavelength or position feedback, there must be some means of maintaining the correlation between control/activation signals and the output wavelength, even in the presence of environmental variations. Temperature variations, for example, cause the drive train, base, pivot arm, and other components within the tunable laser to expand/contract, thereby varying the output wavelength.

The first of these requirements is fulfilled by the combination of a rotary actuator, such as a stepper motor, with the de-amplification provided by a cylindrical nut and a finely pitched lead screw. The pitch of the lead screw determines the amount of linear movement produced that will resolve from each rotation of the stepper motor. As finer pitched thread is utilized on the lead screw 418, the wavelength resolution of the system will increase. In an alternate embodiment of the invention, the wavelength resolution may be increased by increasing the length of the pivot arm.

The second requirement is fulfilled by the combination of the start condition sensors 390–392, the actuator 370, and the lookup table 212. Start conditions sensors may be used to determine a base location for one or more of: the tuning element; the pivot arm; the arcuate, linear or rotary portions of the drive train; or the actuator. In the embodiment shown, the start condition sensors each have a small cavity with a beam of light emitted from one side which is detected on the other side. Interrupting the beam changes the state of the sensor. When the processor 206 (See FIG. 2) initializes the system, the actuator is caused to turn until the upper portion 702 of the flex member either interrupts or clears the light beam of linear sensor 390. If the system exhibits hysteresis, then the direction in which the actuator makes a final approach at the starting point will be the same each time, thus removing the effect of hysteresis. The linear sensor may be positioned on any part of the tuning system, e.g. the drive assembly, pivot arm, tuning element, etc.

Where the accuracy of the linear start condition sensor alone is insufficient to indicate a unique starting condition, the rotary start condition sensor 392 may be used in combination with the linear sensor. Unlike the linear sensor, the rotary sensor does not have a unique start condition where the actuator output shaft makes more than one rotation across the tuning range. Thus, when used in combination, the linear and rotary sensors operate sequentially, with the linear sensor required to give a first indication of a start condition, and the rotary sensor providing a subsequent indication. In this embodiment, the processor actuates the stepper motor in a pre-defined direction, i.e. clockwise or counterclockwise, until the linear sensor is triggered. Subsequently, the stepper motor is backed off in the reverse direction, and then energized in the forward direction until the rotary sensor 392 changes state. The predefined direction for triggering the change of state of sensor 392 assures that backlash/hysteresis is removed from the drive assembly. Sensors other than linear or rotary may be used to signal the start condition. In an alternate embodiment of the invention, the start condition sensor(s) may be electrically coupled to the actuator to sense an overload current/voltage level thereof. When the actuator moves the drive train to a mechanical endpoint, the increase in the drive voltage/current level resulting from the increased load on the actuator could be used to signal the start condition. Alternately, responsive to a unique output wavelength, an inexpensive optical sensor could be used to signal the start condition. In still another embodiment of the invention, microswitches, capacitive sensors inductive sensors, magnetic read switches, etc. could be utilized to signal the start condition.

Once the base condition has been indicated, no further signaling from either the linear/rotary or other start condition sensor is required during the selection of output wavelengths for the device. Instead, an open loop control system is utilized in which the processor using the lookup table determines the type/quantity of drive signals relative to the base state that are required to move the tuning element to the selected output wavelength and drives the actuator accordingly. The actuator accepts drive signals, and responsive thereto produces incremental movements, e.g. arcuate displacements from the base state. Where a high degree of accuracy is required, the lookup table is unique to each device. The processes associated with generating the lookup table are set forth in FIGS. 10 and 18. The processes for generating selected output wavelengths are set forth in the following FIG. 19. Although satisfaction of both the first and second requirements is a necessary condition for implementing an open loop control system for the signal generator, alone or in combination, they are not a sufficient condition where high degrees of wavelength accuracy and resolution are required. The signal generator must be environmentally stable as well.

Figure 12:
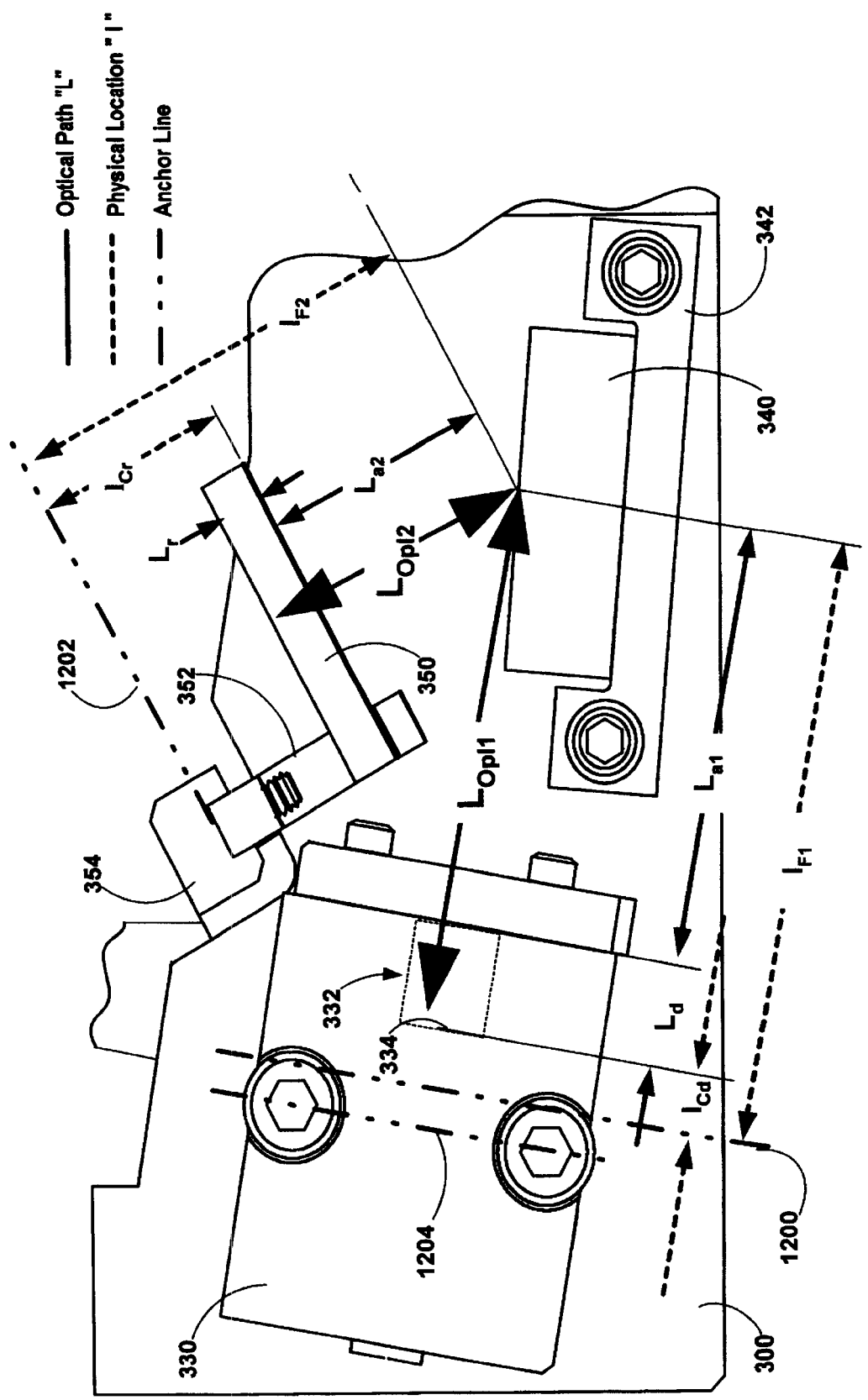
FIG. 12 is a top view of the resonant cavity portion of the tunable laser shown in FIGS. 2–3 with compensating elements for thermally stabilizing the optical pathlength.

One of the primary factors affecting both accuracy and repeatability of the combined drive unit and laser is temperature. Small changes in the angle of the tuning element, induced not by the actuator but by thermal expansion, can vary the output wavelength from one to another of the narrowly separated output wavelengths. Thus, a signal generator without feedback of position or wavelength may not exhibit a unique/repeatable output wavelength in response to a given drive signal sequence unless the signal generator is thermally stable. FIGS. 11A–B and FIG. 12 show embodiments of the invention for thermally stabilizing optical path length. FIG. 13 shows an embodiment of the invention for thermally stabilizing a mechanically actuated tuning element of an external cavity laser.

Generating a Lookup Table

Figure 10:
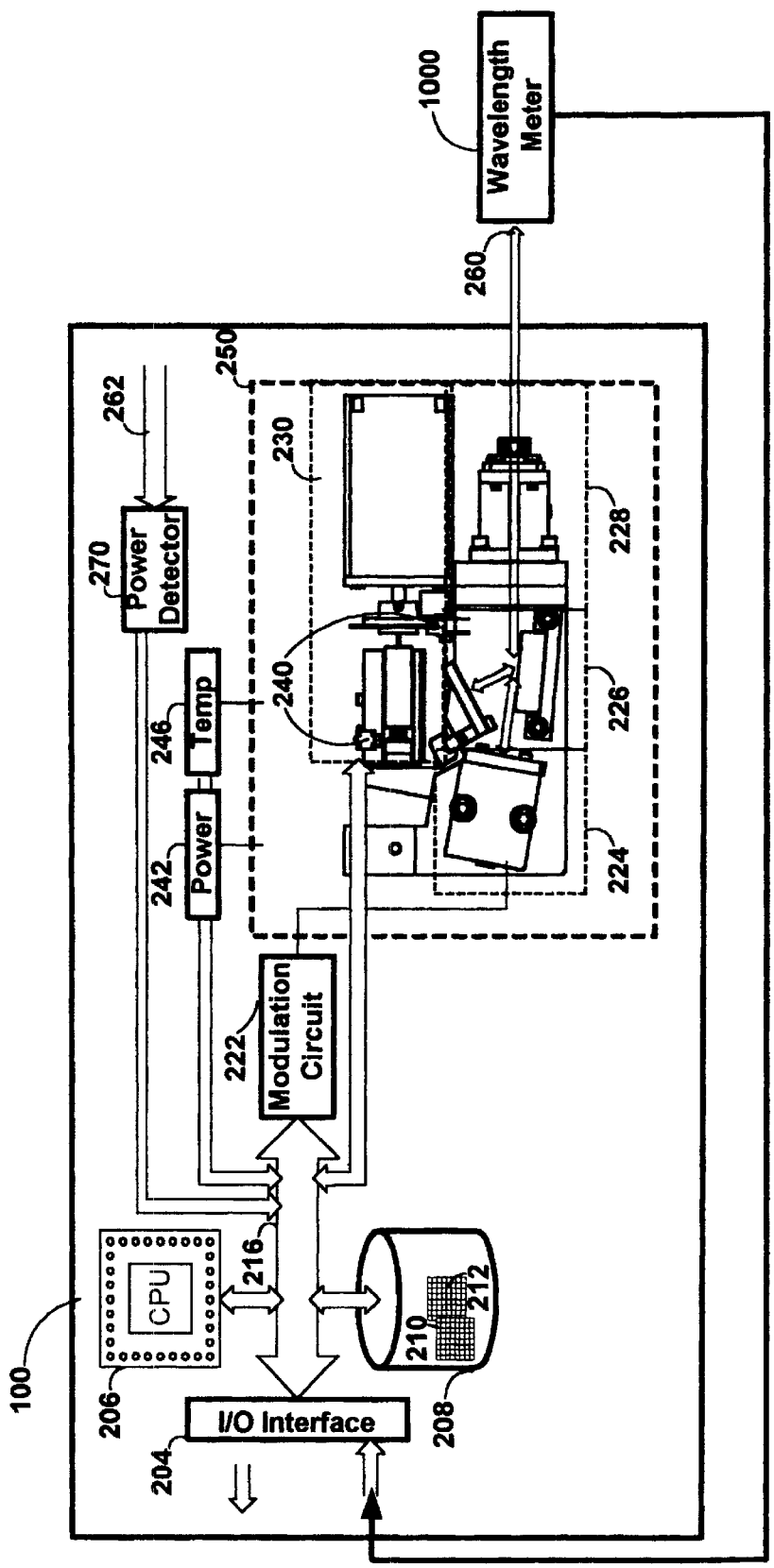
FIG. 10 is a hardware block diagram showing a manufacturing setup configuration for programming and calibrating the signal generator portion of the optical multimeter.

FIG. 10 shows an embodiment of the invention for generating a lookup table. The tunable laser discussed above is superimposed on the multimeter hardware layout shown in FIG. 2. An input of a wavelength meter 1000 is shown connected to the output beam 260 from the signal generator 250. The output from the signal generator is coupled through the I/O interface to CPU 206 and memory 208. During the assembly of each signal generator or groups thereof, the signal generator is hooked up to an external multimeter in a final stage of the assembly process. Next, the processor 206, using program code 210 in memory 208, energizes the actuator 230 and monitors the start condition detectors 240 until a start condition is indicated. Then, the wavelength measured by the wavelength meter is recorded as the first/base record in the database/lookup table 212. Next, the processor sends a known combination/amount/type of activation signals to the actuator 230 which results in the tuning of the laser to a next wavelength level. The combination/amount/type of activation signals is recorded along with the wavelength measured by the wavelength meter in the database/lookup table 212 as the next record therein. The process is repeated to generate subsequent records. Next, additional records may be generated in the lookup table/database by interpolation between existing records. When the population of the lookup table is complete, the table is downloaded/stored in the memory 208 of the multimeter.

In an alternate embodiment of the invention, the lookup table is generated using an external processor and memory in combination with the external wavelength meter. The lookup table is generated in a manner substantially similar to that discussed above. The processor drives the actuator; the wavelength meter indicates the output wavelength of the output beam 260. The processor records the correlation between wavelength and actuator drive signals and stores the results in the lookup table. Then, after the signal generator is assembled into the optical multimeter, the lookup table for the signal generator portion of the multimeter is downloaded to the memory 208. Further details on the processes associated with generating the lookup table/database 212 are set forth in FIG. 18.

Thermally Stabilizing the Optical Path Length

Temperature changes affect the overall cavity length and index of refraction of the cavity, which in turn result in variations in output wavelength as well as mode hops. As the optical length of the laser cavity varies with respect to temperature, the integral number of half-wavelengths that may be supported in the cavity varies. The optical path length of a cavity is a function of the physical thickness of each element, optics and air included in the cavity, and the refractive index of the element. Two elements with identical thickness and different indices of refraction will each support a different number of half-wavelengths along their thickness since the speed of light varies inversely with refractive index. Thus an element with a higher refractive index, e.g. glass, supports a greater number of wavelengths over an identical physical length than an element, such as air, with a lower refractive index.

Once an output wavelength is selected, any variations in the optical path length in the cavity result in discontinuities, a.k.a. "mode hops", in the output beam brought about by variations in the integral number of half-wavelengths in the cavity. These variations may be brought about by a combination of physical path length variations and/or variations in the indices of refraction of the elements within the cavity, including: optics, gain medium, and any gas such as air.

FIGS. 11A–D show alternate embodiments of a tunable laser with a compensating element for passively stabilizing the optical path length of a laser cavity during variations in temperature. FIGS. 11A–C are elevation views of variations on the Littman-Metcalf configuration. FIG. 11D is an elevation view showing the Littrow configuration. Each incorporate compensating elements. The compensating element(s) work by expanding/contracting along the optical axis by an amount sufficient to offset any temperature related contraction/expansion in the optical path length, to thermally stabilize the optical path length. In FIGS. 11A–B a tunable external cavity diode laser with fixed proximal and distal ends and an intermediate tuning element is shown. In FIGS. 11A–B, a compensating element attaches an optical component to the base of the laser in a manner which respectively decreases and increases the optical path length during expansion of the compensating element. In FIG. 11C an external cavity diode laser with a fixed tuning element, e.g. diffraction grating, and a variably positioned proximal and/or distal end(s) is shown with a compensating element which decreases the optical path length during expansion. In FIG. 11D an external cavity diode laser with a fixed gain medium and a variably positioned tuning element is shown with a compensating element which decreases the optical path length during expansion.

The tunable laser of FIG. 11A includes: foundation 1100, gain medium 1120, optical elements 1128, tuning element 1130 and a retroreflector 1126. The optical elements, tuning element and retroreflector provide a retroreflective tuning device which tunes the laser by providing feedback of a selected wavelength to the gain medium. In an embodiment of the invention, the gain medium is a laser diode with front and rear facets 1124–1122, respectively. In various embodiments of the invention, the optical elements 1128 include lenses and filters. In various embodiments of the invention, the tuning element 1130 includes an interference filter, an Etalon, a diffraction element, and a grating. In these embodiments, tuning is accomplished by rotation and/or translation of the tuning element. In other embodiments of the invention, the tuning element includes an optical crystal the wavelength absorption/transmission of which varies with an applied current or voltage. In various embodiments of the invention, the retroreflector includes a mirror, a corner cube and a dihedral prism. A resonant cavity is formed with a length $L_{Opt}$ between the rear facet 1122 of the laser diode 1120 and the retroreflector 1126. The resonant cavity includes an internal cavity between the rear and front facets 1122–1124 of the laser diode and an external cavity between the front facet 1124 of the laser diode and the retroreflector 1126.

At the proximal end, the laser diode 1120 is fixed to the foundation 1100 at pad 1102. At the distal end of the cavity, the retroreflector is fastened to a compensating element 1118. At one end, the compensating element is coupled to the base 1100 at pad 1104. At the opposing end, the compensating element fastens to the retroreflector. Pad 1104 is positioned outside the optical path, beyond the retroreflector. Thus, as the compensating element expands, the retroreflector is pushed into the cavity reducing the length of the cavity. As the temperature of the foundation increases, the separation between pads 1102–1104 changes, typically for most materials, increasing as well. The compensating element 1118 offsets this physical expansion of the base by expanding in an amount which maintains a constant optical path length $L_{opl}$. As will be obvious to those skilled in the art, the compensating element may be positioned elsewhere in the cavity, for example, joining the gain medium to the base, without departing from the scope of the invention. In still another embodiment of the invention, there may be more than one compensating element positioned between, for example, the retroreflector-base and gain medium-base connections.

The compensating element should be designed to maintain an optical pathlength which does not vary with temperature. Satisfaction of this requirement assures that instances of thermally induced mode hopping or variations in output wavelength will be substantially reduced. As shown in FIG. 11A, the optical pathlength $L_{Opl}$ may be expressed as the sum of the optical paths through the individual components of the tunable laser including: the diode 1124, the optical element(s) 1128, the tuning element 1130 and the air gaps $La_1, La_2, La_3$ between the various elements. The optical path length through the diode is $L_d$. The optical path length through the optical element(s) is $L_1$. The optical path length through the tuning element is $L_t$. The optical path length through the air gap between the laser and optical element(s) is $La_1$. The optical path length through the air gap between the optical and tuning element(s) is $La_2$. The optical path length through the air gap between the tuning element and the retroreflector is $La_3$. Since all elements are directly or indirectly coupled in a fixed or pivoting manner to the base 1100, their relative physical separation will typically increase as the temperature of the base increases. This may in turn vary the optical pathlength of the cavity.

The optical pathlength of an element is equal to the product of its refractive index and its dimension along the optical path. The optical pathlength of the cavity of the tunable laser is the sum of the products of index of refraction and thickness along the optical path for all elements, including air, within the cavity. This requirement is expressed in the following Equation I, in which $n_i$ is the index of refraction of each element and $1_i$ the physical thickness of the element along the optical path.

Equation I $$L_{Opl} = \Sigma n_i l_i$$

The lower case "l" will reference the physical dimension of an element and the upper case "L" the optical dimension. The integer number of half-wavelengths supported by an element with fixed endpoints increases as the refractive index of the element increases, as predicted by Huygens principle. This results from the observation that light travels slower in media of higher index of refraction, and the wave peaks are more closely packed. Thus, over an identical distance, an element with a higher index of refraction supports a greater number of wavelengths. Thus, the optical path length rather than physical pathlength is a more accurate measure of the integral number of half-wavelengths which a cavity can support.

Nevertheless, as a first order approximation, the thermal expansion required by the compensating element 1118 is that required to maintain the physical pathlength dimension of the cavity, i.e. $1_{Opl}$ constant. That requirement would be met provided $dl_{F1}/dT = dl_C/dT$ for the configuration shown in FIG. 11A. Given the physical distance between attachment points 1102–1104 and the coefficient of thermal expansion $\alpha_F$ of the base 1100, the required combination of material and thickness between pad 1104 and retroreflector 1126 could be determined so as to hold the physical distance between the cavity endpoints 1122, 1126 constant. There would several sources of error in the first order approximation. First, optical and physical pathlength are not equivalent as discussed above. Instead, for each segment of the optical path, e.g. $L_d$, $L_t$, $L_p$, $L_{a1}$,–$L_{a3}$, the refractive index of each element must be considered in order to hold the integer number of half-wavelengths in the cavity constant. Second, in determining the number of wavelengths each element can support, the expansion of the element must be calculated. Expansion of each element varies depending on its coefficient of thermal expansion and cross-sectional thickness along the optical path. Additionally, during temperature variations, some cavity elements may expand while others contract, thus varying the average weighted refractive index of the cavity. The average weighted refractive index being the sum of the products of the physical length and refractive index of each element divided by the physical length of the cavity. For example, during a temperature increase, the air gap $L_{a3}$ may decrease due to the rapid inward expansion of the compensating element while the optical element(s) increase in thickness. Thus the average weighted refractive index may vary as a result. A third source of error results from the fact that the refractive index of each element varies with temperature and by different amounts. What is needed is a way of incorporating all these variables into the choice of material and thickness for the compensating element(s) so that the cavity is optically stable over a broad temperature range.

A more accurate way of determining the combination of material and thickness for the compensating element(s) 1118 is provided in the following Equation II in which the temperature related variation in optical path length both due to changes in the physical length of each element as well as the change in the index of refraction of each element is expressed.

Equation II $$0 = \frac{dL_{Opl}}{dT} = \sum \frac{d(n_i \cdot l_i)}{dT} = \sum \left( n_i \cdot \alpha_i + \frac{dn_i}{dT} \right) \cdot l_i$$

In Equation II, the requirement that the rate of change of the optical pathlength $L_{Opl}$ with respect to temperature be zero satisfies the condition that the optical pathlength be temperature invariant. The optical path length is expressed as the sum of the derivatives of the product of the refractive index "$n_i$" of each element, the thermal expansion coefficient "$\alpha_i$" of each element and the physical length "$l_i$" of each element. As stated above, the elements of the cavity include: laser, optics, filters, and gasses, such as air, in the optical path.

The optical path of the laser shown in FIG. 11A is the sum of the optical length of the individual segments of which it is composed including the columns of air/gas separating the elements. This relationship is expressed in the following solution EI-1a to the above mentioned Equation I.

Solution EI-1a $$L_{Opl} = L_d + L_l + L_t + L_{a123} = n_d l_d + n_l l_l + n_t l_t + n_a l_{a123}$$

Now the last term, i.e. the air gap length $l_{a1-3}$, is affected by expansion and contraction of the base 1100 as well as the compensating element 1118. The air gap length can be expressed in terms of the dimensions of the base $l_{F1}$ and compensating element $l_c$. The appropriate substitutions have been made in the following Solution EI-1b.

Solution EI-1b $$L_{Opl} = n_d l_d + n_l l_l + n_t l_t + n_a (l_{F1} - l_d - l_l - l_c)$$

Next the terms are rearranged in Solution EI-1c to express the optical path length in terms of: $L_{F1}$ the optical length of the base, $L_O$ the additional optical length produced by the optical elements in the cavity, and $L_C$ the optical length of the compensating element(s).

Solution EI-1c and Equivalent Expression $$L_{Opl} = +[n_a l_{Fl}] + [(n_d - n_a)l_d + (n_1 - n_a)l_1 + (n_t - n_a)l_t] - [n_a l_c]$$

$$'' = L_F + L_O - L_C$$

Then the derivative of $L_{Opl}$ is found and set equal to zero, as indicated in Equation II. This provides a solution for the derivative of the optical length of the compensating element (s) $L_C'$ in terms of the sum of the derivative $L_F'$ of the optical length of the base and $L_O'$ the additional optical length produced by the optical elements in the cavity as set forth in the following Solution EII-1d. The coefficients of thermal expansion $\alpha_c$, $\alpha_F$, $\alpha_d$, $\alpha_l$, for: the compensating element, the base, the gain medium, e.g. laser diode, the lens, and the tuning element, respectively will be utilized in solving the derivative. In addition, the indices of refraction $n_a$, $n_d$, $n_l$, and $n_t$ for air, the diode, the optical elements and the tuning element will be utilized in solving the following derivative.

Solution EII-1d and Equivalent Expression $$[n_a l_c]' = +[n_a l_F]' + [(n_d - n_a)l_d + (n_1 - n_a)l_1 + (n_t - n_a)l_t]'$$

$$L_C' = L_F' + L_O'$$

The derivatives in solution EII-1d may be solved for to produce a solution for the product of the coefficient of thermal expansion and length of the compensating element (s).

FIG. 11B shows a different compensating block to base geometry than that of FIG. 11A. In FIG. 11B, the compensating element attaches the optical component to the base of the laser in the opposite manner to that discussed above. Expansion of the compensating element 1118 in FIG. 11B increases the optical path length during expansion of the compensating element. As in FIG. 11A, the optical path of the laser shown in FIG. 11B is the sum of the optical length of the individual segments of which it is composed. This relationship is expressed in the following solution EI-2a to the above mentioned Equation I.

Solution EI-2a $$L_{Opl} = L_d + L_l + L_t + L_{a124} = n_d l_d + n_l l_l + n_t l_t + n_a l_{a124}$$

As before, the air gap length $l_{a1-3}$ is affected by expansion and contraction of the base 1100 as well as the compensating element 1118, however, in this case the expansion of the compensating element has the opposite effect. The air gap length can be expressed in terms of the dimensions of the base $l_{F1}$ and compensating element $l_c$. The appropriate substitutions have been made in the following Solution EI-2b. Only the sign of the last term has changed from that of Solution EI-1b to reflect the fact that the optical element expansion adds to the cavity length.

Solution EI-2b $$L_{Opl} = n_d l_d + n_l l_l + n_t l_t + n_a (l_{F1} - l_d - l_l - l_t + l_c)$$

Next, the terms are rearranged in Solution EI-2c to express the optical path length in terms of: $L_{F1}$ the optical length of the base, $L_O$ the additional optical length produced by the optical elements in the cavity, and $L_C$ the optical length of the compensating element(s).

Solution EI-2c and Equivalent Expression $$L_{Opl} = +[n_a l_{Fl}] + [(n_d - n_a)l_d + (n_1 - n_a)l_1 + (n_t - n_a)l_t] - [n_a l_c]$$

$$'' = L_F + L_O - L_C$$

Then, the derivative of $L_{Opl}$ is found and set equal to zero, as indicated in Equation II. This provides a solution for the derivative of the optical length of the compensating element (s) $L_C'$ in terms of the sum of the derivative $L_F'$ of the optical length of the base, and $L_O'$ the additional optical length produced by the optical elements in the cavity as set forth in the following Solution EII-2d. The coefficients of thermal expansion $\alpha_c$, $\alpha_F$, $\alpha_d$, $\alpha_l$, for: the compensating element, the base, the gain medium, e.g. laser diode, the lens, and the tuning element, respectively will be utilized in solving the derivative. In addition, the indices of refraction $n_a$, $n_d$, $n_l$, and $n_t$ for air, the diode, the optical elements and the tuning element will be utilized in solving the following derivative.

Solution EII-2d and Equivalent Expression $$-[n_a l_c]' = +[n_a l_F]' + [(n_d - n_a)l_d + (n_1 - n_a)l_1 + (n_t - n_a)l_t]'$$

$$-L_C' = L_F' + L_O'$$

This in turn may be solved to produce a solution for the product of the coefficient of thermal expansion and length of the compensating element(s).

The tunable laser of FIG. 11C also includes: foundation 1100, gain medium 1120, optical elements 1128, tuning element 1130 and a retroreflector 1126. The optical elements, tuning element and retroreflector provide a retroreflective tuning device which tunes the laser by providing feedback of a selected wavelength to the gain medium. In an embodiment of the invention, the gain medium is a laser diode with front and rear facets 1124–1122, respectively. In various embodiments of the invention, the optical elements 1128 include lenses and filters. In various embodiments of the invention the tuning element includes an interference filter, an Etalon, a diffraction element, and a grating. A resonant cavity is formed with a length $L_{Op1}$ between the rear facet 1122 of the laser diode 1120 and the retroreflector 1126. The resonant cavity includes an internal cavity between the rear and front facets 1122–1124 of the laser diode and an external cavity between the front facet 1124 of the laser diode and the retroreflector 1126.

In various embodiments of the invention, the retroreflector includes a mirror, a corner cube and a dihedral prism. In these embodiments, tuning may be accomplished by rotation/translation of the retroreflector 1126 which is pivotally fastened to the base at pivot point 1112 via compensating element 1118 and pivot arm 1110. In alternate embodiments of the invention, the tuning may be accomplished by rotation/translation of the gain medium with respect to the base.

As the temperature of the foundation increases, the separation between pads 1102–1104 changes, typically for most materials, increasing as well. The compensating element 1118 offsets this physical expansion of the base by expanding in an amount which maintains a constant optical path length $L_{opl}$. As will be obvious to those skilled in the art, the compensating element may be positioned elsewhere in the cavity, for example joining the gain medium to the base, without departing from the scope of the invention. In still another embodiment of the invention there may be more than one compensating element positioned between, for example, the retroreflector-base and gain medium-base connections.

FIG. 11D shows a Littrow configuration of an external cavity diode laser with a fixed gain medium and a variably positioned tuning element, e.g. a diffraction grating 1150. The optical elements 1128 and tuning element 1150 provide a retroreflective tuning device which tunes the laser by providing feedback of a selected wavelength to the gain medium. Tuning is accomplished by rotation/translation of the tuning element, e.g. grating 1150 which forms the distal end of the cavity. The grating is pivotally fastened to the base at pivot point 1112 via compensating element 1118 and pivot arm 1110. In alternate embodiments of the invention, the tuning may be accomplished by rotation/translation of the gain medium with respect to the base. A resonant cavity is formed with a length $L_{Opl}$ between the rear facet 1122 of the laser diode 1120 and the tuning element 1150. The resonant cavity includes an internal cavity between the rear and front facets 1122–1124 of the laser diode, and an external cavity between the front facet 1124 of the laser diode and the tuning element 1150.

As the temperature of the foundation increases, the separation between pads 1102–1104 changes, typically for most materials, increasing as well. The compensating element 1118 offsets this physical expansion of the base by expanding in an amount which maintains a constant optical path length $L_{opl}$. As will be obvious to those skilled in the art, the compensating element may be positioned elsewhere in the cavity, for example joining the gain medium to the base, without departing from the scope of the invention. In still another embodiment of the invention there may be more than one compensating element positioned between, for example, the retroreflector-base and gain medium-base connections.

FIG. 12 is a top plan view of the resonant cavity portion of the tunable laser signal generator 250 (See FIG. 2). The laser is tuned by a retroreflective tuning device which tunes the laser by providing feedback of a selected wavelength to the gain medium, e.g. laser diode 332. The tuning device includes diffraction grating 340 and retroreflector 350. The relative physical location of the laser components is affected by the expansion of the base and further by expansion of any intermediate elements, e.g. housings, or mounting blocks, which may be used to fasten the laser components to the base. Laser components in FIG. 12 include: laser diode 334, diffractor 340, retroreflector 350, as well as any lens or filters that may be present. Housing 330, diffraction mount 342 and compensating element 352 are intermediate elements used to fasten the corresponding laser component to the base. A resonant cavity is formed with a length $L_{opl1}+L_{opl1}$ between the rear facet 334 of the laser diode 332 and the tuning element 350. The resonant cavity includes an internal cavity between the rear and front facets 1122–1124 of the laser diode and an external cavity between the front facet of the laser diode and the tuning element 350.

Absent intermediate members, the relative physical separation between optical components will increase with temperature since all components are attached in a fixed or pivotal manner to a common base which expands with an increase in temperature. Intermediate members may be used to either increase or decrease the relative physical separation between optical components during a temperature-induced expansion of the base. In the embodiment shown, all intermediate members, i.e. housing 330, diffraction mount 342 and compensating element 352, make contact with the base at locations outside the optical path. Laser diode 332 is coupled via housing 330 to the base. The housing contacts the base at contact line 1200, which is displaced outside the optical path by distance $l_{Cd}$. The laser housing is fastened to the base by fasteners along a centerline 1204. Thus, expansion of the housing reduces the length of air gap $l_{a1}$, between the front facet of the laser diode and the diffraction grating. Diffraction grating 342 is coupled via mount 340 to the base. For purposes of simplifying the solution set that follows, it is assumed that the diffraction mount 342 and base have identical coefficients of expansion and that the expansion coefficient of the diffraction grating is zero. In this specific case the intermediate component, i.e. mount 342, does not create relative expansion/contraction of the diffraction grating surface with respect to the base. Were this not the case, the solution set that follows would take into account the reduction in length of both optical path segments $L_{Opl1}$ and $L_{Opl2}$ resulting from differential expansion of the surface of the diffraction grating and the base. Retroreflector 350 is coupled via compensation element 352 to the pivot bracket 354, which is in turn pivotally coupled to the base 300. The compensation element contacts the pivot bracket at contact line 1202, which is displaced outside the optical path by distance $l_{Cr}$. Thus, expansion of the compensation element reduces the length of air gap $l_{a2}$ between the front face of the retroreflector and the diffraction grating.

As will be obvious to those skilled in the art, intermediate members may be fabricated in different lengths of different materials, with varying coefficients of expansion less than, or greater than that of the base. If they have higher coefficients of thermal expansion than the base to which they are attached, then their expansion tends to decrease the physical separation between components and may be used to counteract or completely offset expansion of the base. Conversely, were the intermediate components rearranged to make contact with the base at locations within the optical path, they would have the opposite effect, i.e. increasing the relative separation between optical components beyond what would be the case, were the optical components attached directly to the base. Thus, one or more intermediate members may be used with a base and laser components to thermally induce separations between optical components which either vary directly/inversely with temperature. This capability will be relied on to fabricate a thermally stable signal source.

As discussed above in Equation II, the requirement of a thermally stable optical pathlength is met when the rate of change of the optical pathlength $L_{Opl}$ with respect to temperature is zero. In the embodiment shown in FIG. 12, the optical path of the laser is folded to include two distinct segments $L_{Opl1}$ and $L_{Opl2}$, between the laser diode 332 together with the diffraction grating 340, and the diffraction grating together with retroreflector 350, respectively. The total optical pathlength $L_{Opl12}$ is the sum of the optical length of all optical components within each of the segments including the columns of air/gas separating the elements. This relationship is expressed in the following solution EI-3a to the above-mentioned Equation I.

Solution EI-3a $$L_{OPl2}=L_d+L_r+L_{a12}=n_d l_d+n_r l_r+n_a l_{a12}$$

Now the last term, i.e. the air gap length $l_{a12}$ is affected by expansion and contraction of the base 300 as well as the compensating element 352 and housing 330. The air gap length can be expressed in terms of the dimensions of the base $l_{F1\text{-}2}$, compensating element $l_{Cr}$ and diode housing $l_{Cd}$. The appropriate substitutions have been made in the following Solution EI-3b.

Solution EI-3b $$L_{OPl2}=n_d l_d+n_r l_r+n_a(l_{F1}-l_{Cd}-l_d+L_{F2}-l_{Cr})$$

Next the terms are rearranged in Solution EI-3c to express the optical path length in terms of: $L_{F12}$ the optical length of the base, $L_O$ the additional optical length produced by the optical elements in the cavity, and $L_C$ the optical length of the compensating element(s).

Solution EI-3c and Equivalent Expression $$L_{Opl12} = +[n_a(l_{F1} + l_{F2})] + [(n_d - n_a)l_d + n_r l_r] - [n_a(l_{Cd} + l_{Cr})]$$

$$\phantom{L_{Opl12}} '' = L_F + L_O - L_C$$

Then the derivative of $L_{Opl12}$ is found and set equal to zero, as indicated in Equation II. This provides a solution for the derivative of the optical length of the compensating element(s) $L_C'$ in terms of the sum of the derivative $L_F'$ of the optical length of the base and $L_O'$ the additional optical length produced by the optical elements in the cavity as set forth in the following Solution EII-3d. The coefficients of thermal expansion $\alpha_{Cd}$, $\alpha_{Cr}$, $\alpha_{F12}$, $\alpha_d$, $\alpha_r$ for: the laser housing, compensating element, base, diode, retroreflector respectively will be utilized in solving the derivative. In addition, the indices of refraction $n_a$, $n_d$, and $n_r$ for air, the diode, and the tuning element will be utilized in solving the following derivative. Additionally, where a collimating lens is positioned at the output of the laser diode the index of refraction and thermal expansion coefficient for that element would appear as well in the following equation.

Solution EII-3d and Equivalent Expression $$[n_a(l_{Cd} + l_{Cr})]' = +[n_a l_{F12}]' + [(n_d - n_a)l_d + n_r l_r]'$$

$$L_C' = L_F' + L_O'$$

This in turn may be solved to produce a solution for the product of the coefficient of thermal expansion and length of the compensating element(s).

In an alternate embodiment of the invention the length of the compensating elements can be obtained experimentally by measuring the wavelength of the composite cavity and using this information to determine the length of the compensating element(s).

Thermally Stabilizing the Drive Train

Figure 13D:
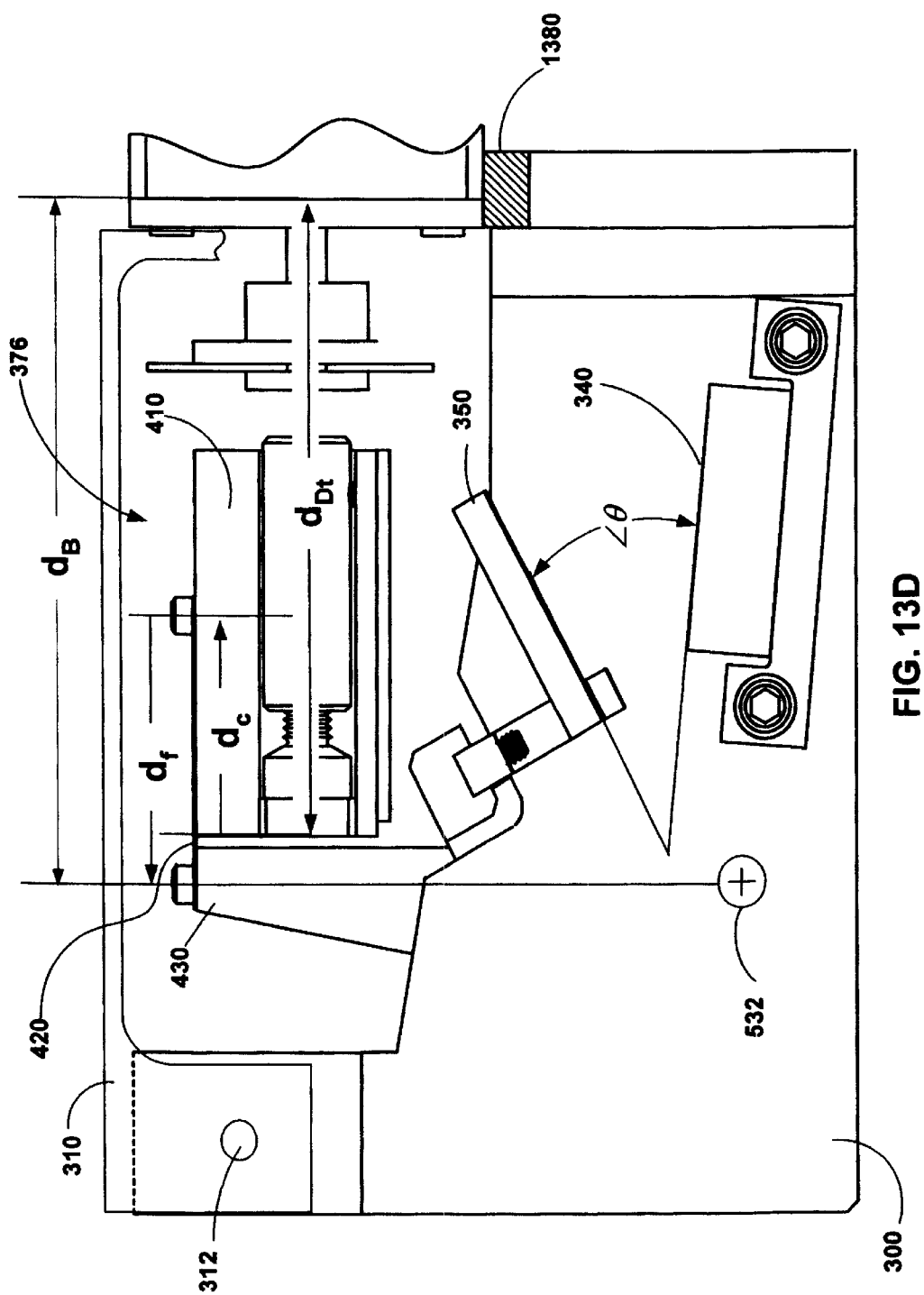

Thermal variations in a mechanically tuned laser affect not only the optical pathlength but also the angle of the tuning element. Both optical pathlength variations, as well as changes in the tuning angle, contribute to thermally induced mode hop and wavelength variations in the output beam. Typically, thermal stabilization of the optical pathlength as discussed above, is a necessary but not sufficient condition for reducing thermally induced mode hop and wavelength variations in the output beam. FIGS. 13B–D show embodiments of the invention for passive thermal stabilization of the angle of a tuning element in a mechanically tuned laser. FIG. 13A shows a prior art design in which variations in the tuning angle may be thermally induced.

FIG. 13A shows a prior art design for a mechanical drive train to move the tuning element of an external cavity laser. A base 1300, pivot arm 1302, tuning element 1310, lead screw 1340 and threaded block 1320 are shown. The pivot arm is fastened to the base 1300 at pivot point 1304. The tuning element 1310, e.g. retroreflector, grating, etalon, etc., is attached to the pivot arm such that arcuate movement of the pivot arm, induced by the lead screw 1340, tunes the laser (not shown). The lead screw is flexibly attached to the tip of the pivot arm 1342. The lead screw has an elongated threaded portion extending from the tip of the pivot arm through a threaded opening in the threaded block to a drive end 1344 of the lead screw. The threaded block is fixed to the base 1300. As the lead screw is rotated by an actuator (not shown), it moves linearly along a line tangent to the tip of the pivot arm. The arcuate motion of the pivot arm induced, thereby tunes the laser by rotating the tuning element to a specific angle with respect to the base. This in turn selects a specific output wavelength for the laser. At any selected output wavelength, the angle must be held constant during temperature variations in order to avoid variations in the output wavelength. In the prior art case shown in FIG. 13A, this requirement is met only when the thermal expansion coefficient $\alpha_{Dt}$ of the lead screw 1340 and base $\alpha_B$ are identical. In the unique case where this condition is met, the expansion of the drive train, e.g. lead screw, along length $D_{Dt}$ will equal that of the base $D_B$ over the distance separating the tip of the pivot arm from the centerline of the threaded block 1320. In a practical implementation, this condition will typically not be met since the base is typically fabricated from a very hard, thermally inert material such as a nickel-steel alloy, and the lead screw of a soft, easily machined material with a relatively high coefficient of expansion, such as brass. Therefore, in the typical case, the prior art drive train design is not thermally stable since the differential expansion of the drive train exceeds that of the base. Thus, prior art tunable lasers are subject to temperature induced tuning of the laser, i.e. "thermal tuning", which creates undesirable variations in the output wavelength of the laser and/or mode hopping. Therefore, what is needed is a way to use materials suitable for the drive train and base without the requirement that they have identical expansion coefficients.

FIGS. 13B–D show various embodiments of the invention for thermally stabilizing the drive train. A compensating element is provided to offset the differential expansion between the base and the drive assembly. In the embodiments shown, the compensating element is linked to the drive train in a geometry which offsets the differential expansion thereby enhancing the thermal stability of the tuning element at any selected output wavelength.

FIG. 13B shows a drive train similar to that discussed above in connection with FIG. 13A, with the exception of compensating element 1322 which couples the drive train to the base. The compensating element is U-shaped with a threaded opening in the base and with a rim which is affixed to the base. The compensating element is laid out on its side with the lead screw passing through the opening in the rim and through a threaded opening in the base of the compensating element to a point of termination at the drive end 1344 of the lead screw. The compensating element typically has an overall thermal expansion greater than that of the base 1300 by an amount sufficient to compensate for differential expansion of the base and lead screw. That relationship is expressed in the following Equation III, where $d_B$ is the length of the base from the tip of the pivot arm to the fastening point for the rim 1324, $d_c$ is the length of the compensating element, and $d_{dt}$ is the lead screw length from the tip of the pivot arm to the base of the compensating member. The thermal expansion coefficients for the compensating element, base, lead screw are: $\alpha_c$, $\alpha_{dt}$, $\alpha_b$ respectively.

Equation III $$+\alpha_c d_c = \alpha_{dt} d_{dt} - \alpha_b d_b$$

FIG. 13C shows an alternate embodiment of the compensating element for thermally stabilizing the mechanical drive train. In this embodiment, the lead screw is stationary and is rotatably fastened at opposite ends to the base via pillow blocks 1330 and 1328 on either side of pivot arm 1304. Shoulders on the lead screw on either side of pillow block 1328 maintain a fixed relationship between the lead screw and that pillow block. Expansion of the lead screw exhibits itself at pillow block 1330 in which the lead screw is free to move linearly. Movement of the tip of the pivot arm results from the threaded attachment at an intermediate point on the lead screw of a threaded portion of the base of compensating element 1350, with the rim of that element attaching to the tip 1342 of the pivot arm. As the lead screw rotates in a clockwise or counterclockwise direction, the threaded base of the compensating element is caused to undergo linear translation along a line tangent to the tip. This movement produces arcuate movement of the tip to tune the laser. The compensating member 1350 offsets the differential expansion between the drive train assembly, e.g. lead screw 1340, and the base by expanding in a direction opposite to the expansion of the lead screw so as to maintain the pivot arm in a fixed position. That relationship is set forth in Equation III above.

As will be obvious to those skilled in the art, the thermal stabilization provided by the compensating element is equally applicable to laser drive trains such as: piezo-electric actuators, solenoids, linear stepper motors, etc., without departing from the scope of the invention.

FIG. 13D is a top plan view of the embodiment of the tunable laser discussed above in connection with FIGS. 3–9. The base 300, drive train 376, retroreflector 350, diffraction grating 340, pivot arm tip 430 and motor attachment bracket 310 are shown. The hole 532 about which the pivot arm rotates is shown. In the embodiment shown, the drive shaft including stepper motor output shaft, rotary flex member, cylindrical nut, and lead screw, has a length of $d_{Dt}$. The compensation element 410 is coupled to the end of the drive shaft to the head of the lead screw. As the drive shaft expands along length $d_{Dt}$, the compensating element expands in the opposite direction over the length $d_c$ to the point at which one end of the linear flex member 420 is coupled to the compensating element. The compensation element will typically have a coefficient of expansion greater than either the drive train or the linear flex member. It is dimensioned such that its expansion offsets the difference between the expansion of the drive shaft together with the linear flex member from that of the base. In the embodiment shown, for purposes of simplification, the faceplate of the stepper motor at which the drive shaft originates is assumed to be fixed to the base at location 1380. The base expands over the distance $d_B$ measured from the tip 430 of the pivot arm to the origin of the actuator drive shaft. These parameters are set forth in accordance with Equation III in the following solution EIII-1a.

Solution EIII-1a $$+\alpha_c d_c = (\alpha_{dt} d_{dt} + \alpha_b d_b) - \alpha_b d_b$$

In this embodiment of the invention, passive thermal compensation of the drive train achieves the effect of maintaining a stable angle between the tuning elements, i.e. retroreflector 350 and the diffraction grating 340. This assures that the output wavelength will remain temperature invariant on any output channel/frequency. In combination, passive thermal pathlength compensation and thermal compensation of the drive train also substantially reduce mode hopping. As will be obvious to those skilled in the art, it is evident that the roles of the lead screw and cylindrical nut may be reversed without departing from the scope of the invention. In an alternate embodiment of the invention, the length of the compensating element(s) can be obtained experimentally by measuring the wavelength of the composite cavity and using this information to determine the length of the compensating element(s).

Accurate Positioning of Components

Thermal path length compensation requires accurate positioning of the laser components. In addition to accurate positioning, the line/point of contact between each component of the laser system, as well as any intermediate elements necessary to fasten them to the base, must be determined. In order to properly dimension compensating elements, such as the laser housing, it is preferable that they frictionally contact the base along a narrow and well-defined line of contact. From this line of contact, expansion and contraction calculations necessary for determining the length and material combination for the intermediate compensating components may be calculated.

Figure 14B:
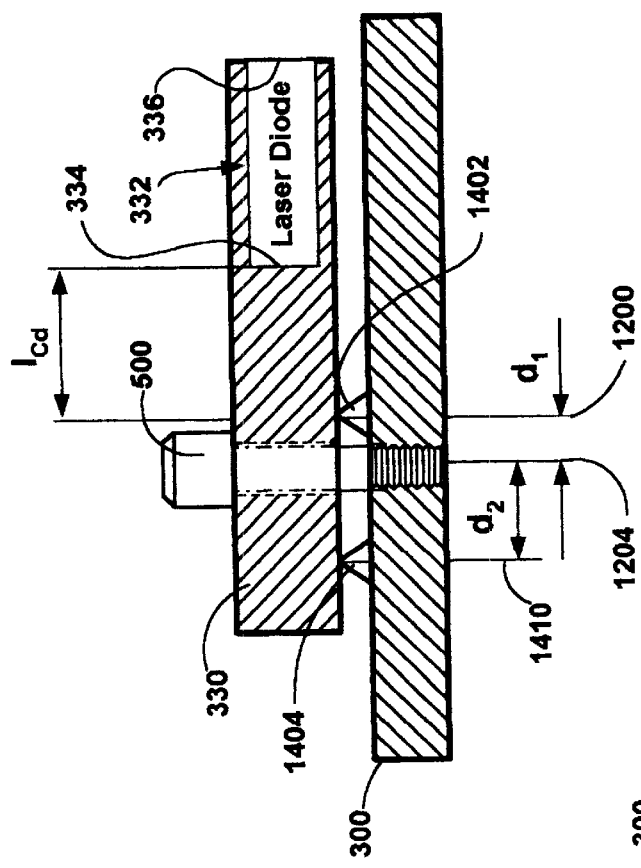
FIG. 14B is a cross-sectional side view of the mounting system shown in FIG. 14A.
Figure 14A:
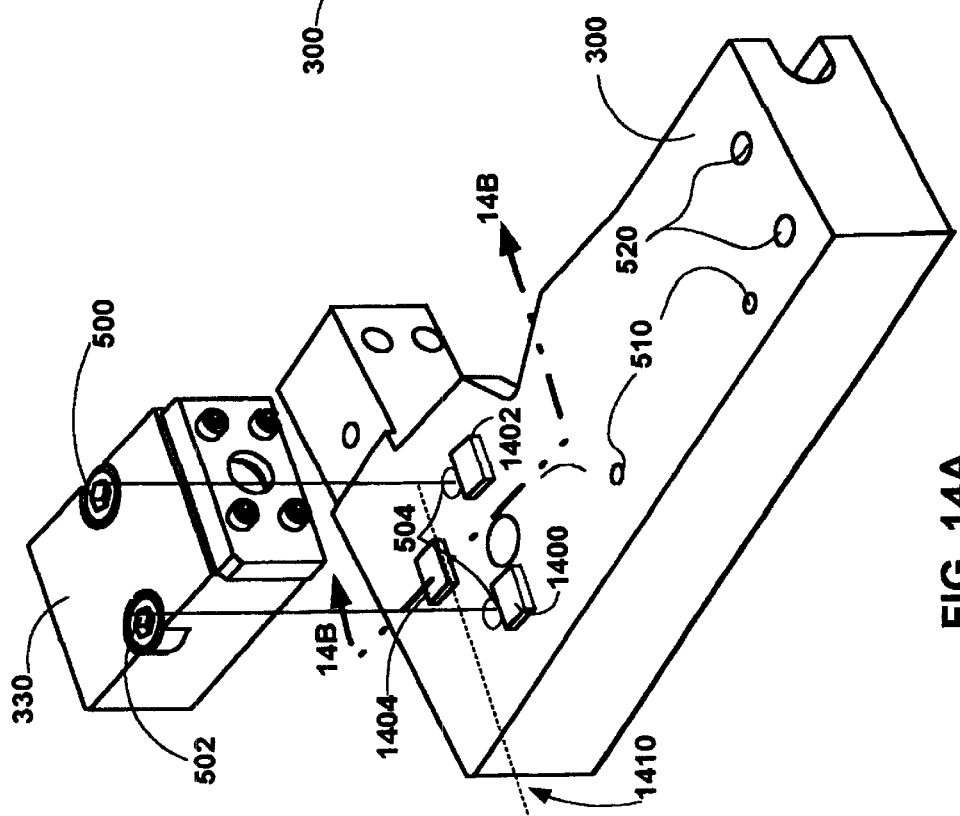
FIG. 14A is an isometric view of a mounting system for attaching both intermediate and optical elements of a tunable laser to a base.

FIGS. 14A–B show respectively an isometric exploded view and a side cross-sectional view of pads which are used, in an embodiment of the invention, to position the laser components with respect to one. These pads improve the precision of the relative thermal expansion calculations necessary to dimension the laser components and intermediate elements properly so as to thermally stabilize the optical path length (See FIGS. 11A–D and 12). They do so by reducing the contact area between the attached objects, e.g. a laser component or intermediate element and the base. Additionally the pads serve to provide three points of contact or contact along a line together with a point of contact to level the device as well as accurately position it. Typically two or more pads will be utilized between the attached objects. Where two pads are utilized, the first, a contact pad, will typically provide a narrow line of contact from which expansion calculations are performed while the second, a leveling pad, provides a low friction surface area to level the attached component or intermediate element. The line of contact provided by the contact pad will typically be orthogonal to the optical path. The contact pad will typically have a triangular or narrow rectangular cross-section to increase frictional contact between it and the objects between which it is sandwiched. The leveling pad will typically have a broad rectangular cross-section with a smooth surface to allow the objects on either side to move relative to one another during thermal expansion/contraction. Fasteners between the contact and leveling pad will be utilized to apportion the loading on each. Typically, the greater loading will be placed on the contact pad to increase the friction between it and the objects between which it is sandwiched. A reduced loading on the leveling pad allows relative movement between the objects on either side. The pads may be separate from the corresponding attached object or part of either of them. In the absence of these contact pads, thermal expansion calculations would be made from the centerlines of the fasteners used to couple laser components or intermediate elements to the base. This latter technique may lack the precision provided by the contact pads due, for example, to the slop between fasteners and the thru and threaded holes of the attached objects.

In FIG. 14A, a three pad fastening system is shown for the attachment of the laser housing 330 to the base 300. There are two contact pads 1400–1402 and one leveling pad 1404. Within the base are defined the fastening holes 504, 510 and 520 for fastening respectively the laser housing 330, diffraction mount 342 and fiber mount 302 to the base (See FIGS. 3–5). Pads 1400–1404 are positioned between the base 300 and the laser housing 330. The two contact pads 1400–1402 are aligned with one another along contact line 1200 which is generally orthogonal to the optical path.

These two pads provide the frictional contact with the housing from which thermal path length calibration will be calculated. The remaining leveling pad 1404 is laid out on axis 1410 and serves to level the housing and has a light enough contact with the housing so that the housing is slidably positioned with respect to this pad. The laser housing 330 is brought into contact with the pads by fasteners 500–502 which threadably engage holes 504 having a centerline 1204 within the base 300.

FIG. 14B shows a cross-sectional side elevation view of the base 300 and laser housing 330. The housing is shown contacting both contact pad 1402 and leveling pad 1404. Fasteners 500 are shown positioned at a distance $d_1$ from the contact pad 1402, and a distance $d_2$ from the leveling pad 1404. The contact force between the laser housing and the contact pad is $F \times d_2/(d_1+d_2)$ where "F" is the fastening force. As $d_1$ decreases, the force on the leveling pad, i.e. $F \times d_1/(d_1+d_2)$, decreases as well. The separation $l_{cd}$ between the contact pad 1402 and the rear facet 334 of the laser diode 332 (See FIG. 3.) is selected in combination with the thermal expansion coefficient of the laser housing material to provide, in combination with the other components and compensating elements of the tunable laser, a thermally stable optical pathlength as discussed above in connection with FIGS. 11A–B and 12. In alternate embodiments of the invention the contact pads may be integral with either of the elements being fastened, or may be fastened between them. The contact pads may have varying cross sectional profiles with the contact pad(s) typically having a narrow high friction profile to prevent relative movement of the objects being fastened. The leveling pad by contrast has typically a planar surface to minimize friction and allow relative expansion between the objects fastened.

Active Thermal Compensation

In an embodiment of the invention, active thermal stabilization may be utilized alone or in combination with the passive techniques discussed above to maintain wavelength stability and avoid mode hopping. Active thermal compensation avoids temperature related wavelength variations and mode hopping by maintaining the tunable laser components at a constant temperature. By actively adding or removing energy from the cavity responsive to feedback from temperature/energy monitors, a relatively constant thermal state can be maintained for the tunable laser. This approach requires heaters/coolers as well as closed loop feedback sensors and circuitry. In an alternate embodiment of the invention a less expensive approach to active thermal stabilization may be implemented. In this approach there is no active feedback, relying instead on maintaining a temperature in the tunable laser that is significantly above or below the ambient condition so as to reduce external environmental effects on the laser. To avoid additional components such as heaters/refrigerators, it is advantageous to utilize the existing components in the system where possible to provide the requisite energy input. The actuator holds such potential. In a stepper motor, for example, energy is consumed in moving the tuning element from one to another output wavelength. By designing the stepper motor control to output a constant power level at any pole, or phantom pole, and even in a locked condition, the overall thermal variations in the tunable laser may be kept at a relatively constant temperature.

Figure 15:
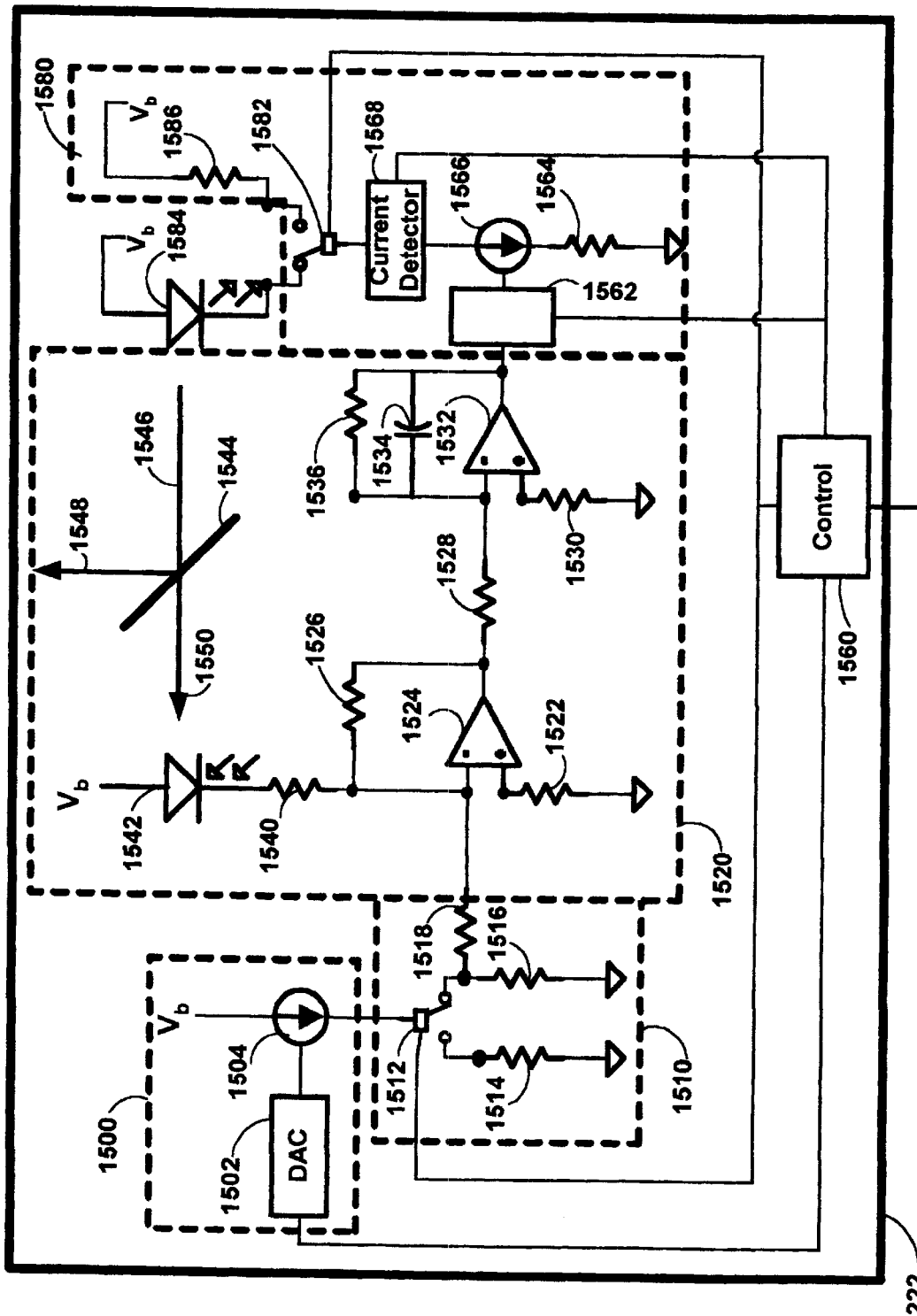
FIG. 15 is a detailed circuit diagram of an embodiment of a modulation circuit for driving the signal generator shown in FIG. 2.

FIG. 15 shows a detailed circuit diagram of an embodiment of the modulation circuit 222 discussed above in connection with FIG. 2. The circuit provides, as is shown in the following FIG. 16, a range of analog and digital modulation which is suitable for testing the various optical components associated with an optic network (See FIG. 1). The circuit provides a relatively low-frequency feedback loop for maintaining a stable output power that operates in combination with a relatively high frequency open loop switched threshold voltage source 1510 and a laser power shunt to inject a digital modulation signal onto a selected peak output power of the optical signal generator. The modulating circuit includes a setpoint module to generate a fixed output current/voltage, a first modulation module 1510 to switchably connect the output of the setpoint module to an input of the feedback module 1520; and a second modulation module 1580 to switchably connect the laser diode/gain medium 1584 to a current source 1566 and a control unit. The laser diode/gain medium 1584 is part of the tunable laser, e.g. gain medium 224 in FIG. 2 or laser diode 332 in FIG. 4.

In the embodiment shown, the set point module comprises an analog to digital converter 1502 and a voltage controlled current source 1504. The analog to digital converter 1502 drives the voltage controlled current source 1504 to a specific output current/voltage which is provided as an input to the first modulation module 1510.

The first modulation module 1510 includes a transistor switch 1512, pull down resistor 1514, and resistor bridge 1516–1518. In a first position, switch 1512 couples the input from the set point module to the pull down resistor 514, which is in turn coupled to ground. In a second position, the switch 1512 couples the output of the set point module to the node formed between resistors 1516–1518. This raises or lowers the voltage at the node of the resistor bridge. The resistor bridge is coupled at one end to a ground within the first set point module 1510, and at the alternate end provides an input to the low frequency feedback module 1520.

The low frequency feedback module accepts inputs from the laser diode 1584 and the first modulation module 1510, and provides an output to the analog modulator 1562 and the voltage controlled current source 1566 to which it is attached. The feedback module includes: a beam splitter 1544, a photodetector 1542, a summer, and an integrator. In the embodiment shown, the summer is an op amp 1524 with a bridging resistor between the negative input and output. The positive output of the op amp is coupled via resistor 1522 to ground. The negative input of the op amp couples both to the output resistor 1518, which is part of the first set point module 1510, as well as to the photodetector 1542 via intermediate resistor 1540. Thus, at the negative input, the op amp sums the current provided by the first modulation module with the current withdrawn by the photodetector 1542. The output of the summer is coupled via resistor 1528 to the input of the integrator. The integrator includes: op amp 1532, bridging capacitor 1534, and resistor 1536, which couple between the negative input of the op amp and the output. The positive input of the op amp is coupled via resistor 1530 to ground. At the output, the integrator couples via analog modulator 1562 to the voltage controlled current source 1566. Within the feedback loop, the beam splitter 1544 accepts as an input the output beam 1546 provided by laser diode 1584. This beam is split into an output portion 1548 and a feedback portion 1550. The feedback portion 1550 drives the photodetector 1542. When the system is in equilibrium, the amount of current withdrawn by the photo diode 1542 would be equivalent to the current provided by the first modulation module 1510 at the negative input of the op amp 1524. In this steady state condition, the amount of current provided by current source 1566 will be that required to drive the laser diode 1584 at a power level determined by the output level of the set point module 1500. Any variations in the set point module will result in more or less current provided by the current detector 1566.

The laser diode 1584 couples to the second modulation module 1580. The second modulation module includes a switch 1582 and a pull up resistor 1586. The switch switchably couples either the laser diode 1584 or the pull up resistor 1586 to the current source 1566, which is in turn connected via resistor 1564 to ground. The current detector 1568 monitors the current through laser diode 1584.

The control module provides a control input to the set point module 1500 and specifically the analog to digital converter 1502 therein. The control module also provides control inputs to both switches 1512 and 1582 in, respectively, the first and second modulation modules. Additionally, the control module provides an input to analog modulator 1562. The control module accepts input from the current detector 1568. The control module 1560 is in turn coupled via system bus 216 to the processor 206 (See FIG. 2).

In operation, the user selects an output channel/wavelength for the optical signal generator which is tuned to that wavelength via the actuator and drive train assembly, lookup table and processor as discussed above and in the following FIG. 19. Next, a specific power level, digital modulation frequency, and duty cycle are selected. Responsive to the power selection, the control module 1560 generates a signal to the analog to digital converter 1502 within the set point module which results in the appropriate current being delivered by current source 1504 to the first modulation module 1510. Then, responsive to the user-selected modulation frequency and duty cycle, the control unit 1560 generates signals which cause switches 1512 and 1582 within the first and second modulation modules to switch between poles at a rate and duty cycle proportional to the inputs from the control module. Switches 1512–1582 are operated substantially synchronously such that in the first position switch 1512 shunts the output of the setpoint module via resistor 1514 to ground and switch 1582 in the first position couples the pull up resistor 1586 to the current source 1566. Thus, in the first position, no input is provided from the first modulation module to the feedback unit 1520, and no current is delivered to the laser 1584. In the second position, switch 1512 couples the output of the set point module to the resistor bridge 1516–1518 which provides control input to the feedback module 1520, and specifically the summer thereof. In the second position, switch 1582 couples the laser diode 1584 to the current source 1566. By virtue of the substantially synchronous operation of switches 1512 and 1582, the relatively low frequency feedback circuit 1520 is not required to engage in digital modulation, seeking instead a relatively constant peak output state that can be maintained across any range of duty cycles and modulation frequencies which can be implemented by switches 1512–1582.

An additional feature of the modulation circuit 222 is that analog modulation capability is provided. At a constant DC power level or during digital modulation, control module 1560 can provide an analog input to analog modulator 1562. In an embodiment of the invention, analog modulator 1562 is a pull down resistor which adds or removes current from the line connecting the output of the integrator to the voltage controlled current source. An additional feature of the modulation circuit is the provision of overload current protection provided by detector 1568. Detector 1568 provides a signal proportional to the current through the laser diode 1584. The signal is provided to the control module 1560 which, in conjunction with the processor 206 to which it is coupled, causes the switch 1582 to de-couple the laser diode 1584 from the current source 1566 when an overload condition is detected.

As will be obvious to those skilled in the art the modulator may be implemented using either analog or digital circuits or software, singly or in combination without departing from the scope of the invention. In one digital embodiment of the circuit an integrator within the error detector/feedback circuit 1520 would integrate only in the on state when the laser diode was coupled to the current source.

The modulating circuit shown in FIG. 15 may be utilized with equal advantage in numerous lasers including: distributed feedback lasers, YAGG lasers, gas lasers, tunable semiconductor lasers, distributed Bragg reflectors, etc., without departing from the scope of the invention. In fact, the modulating circuit may be utilized in any laser in which modulation of output beam intensity can be accomplished.

Figure 16:
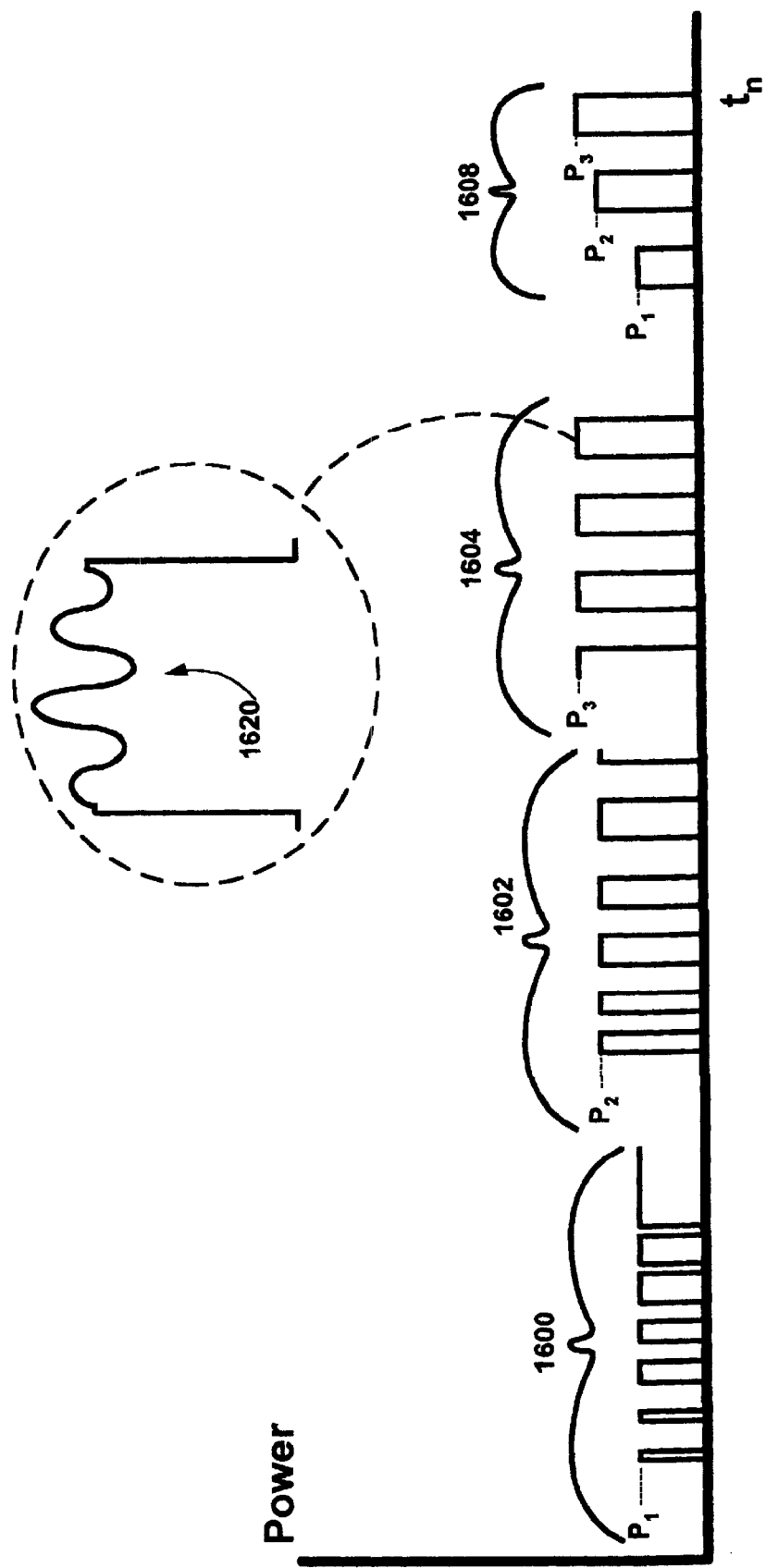
FIG. 16 shows modulated waveforms generated by the signal generator portion of the optical multimeter.

FIG. 16 is a graph showing some of the various optical output signal profiles which can be generated by the optical signal generator 250 (See FIG. 2) under the control of the modulation circuit 222 (See FIGS. 2, 15). The laser output beam may be modulated across a range of duty cycles, frequencies and power levels. Signal sequences 1600–1604 are shown. In signal sequence 1600, the set point module 1500 (See FIG. 15) provides a fixed output current/voltage while the first and second modulation module alternately de-couple and couple the set point module and laser diode from the feedback circuit 1520 across a range of duty cycles at a fixed frequency and a power level $P_1$. In signal sequence 1602, the set point module 1500 (See FIG. 15) provides a second power level $P_2$ while the first and second modulation modules couple and de-couple the laser diode and set point module with the feedback circuit across a range of frequencies at a fixed duty cycle. In signal sequence 1604, both the frequency and the duty cycle of the first and second modulation modules is fixed, and the set point module 1500 delivers a voltage/current sufficient to drive the current source 1566 (See FIG. 15) at a third power level $P_3$. In signal sequence 1608, a fixed duty cycle and frequency is provided by the control module to the first and second modulation modules 1510–1580 (See FIG. 15), while the set point module 1500 is ramped from the first to the third power level. Enlarged signal diagram 1620 shows a portion of signal sequence 1604 in which the analog modulator 1562 under the control of the controller 1560 (See FIG. 15) injects an analog signal onto the output beam 1548 by modulating the current source 1566. This analog sequence is injected only on the positive going digital modulation sequence since only during that portion of the signal sequence is the laser diode 1584 coupled to the current source 1566.

Figure 17:
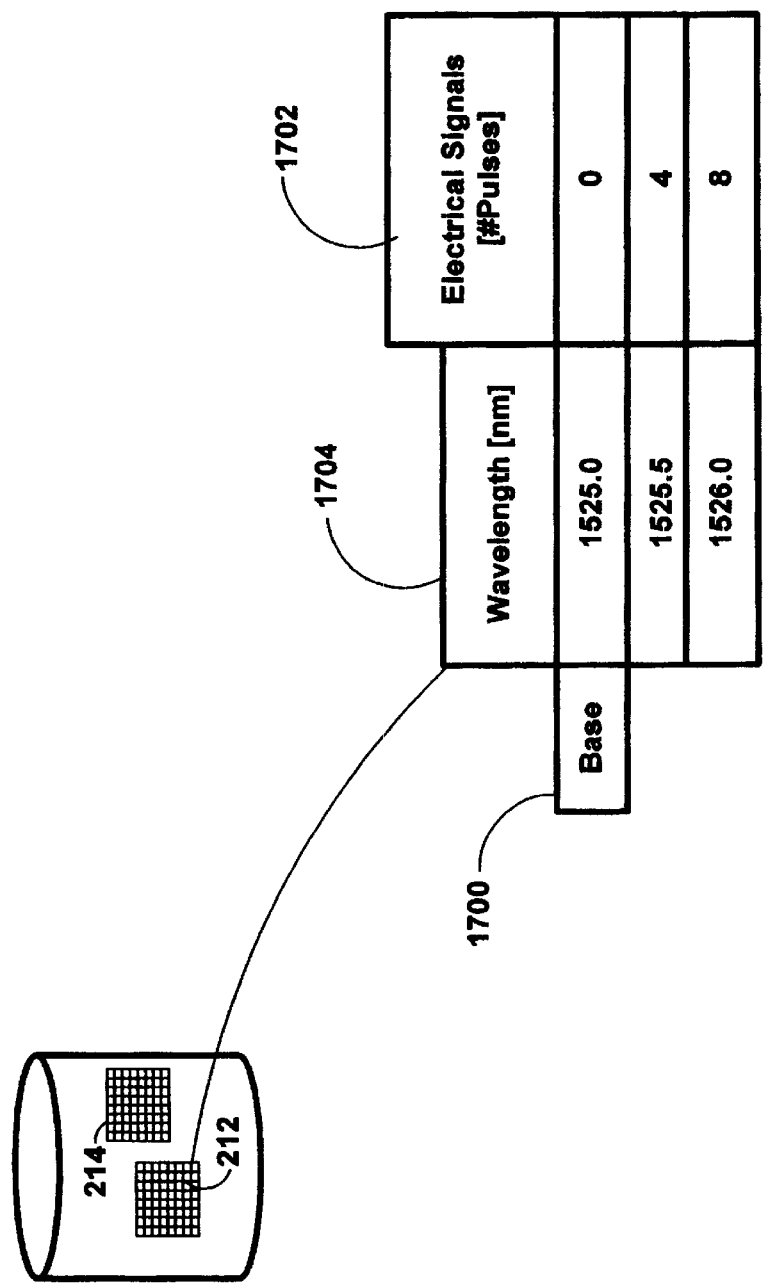
FIG. 17 shows a data lookup table utilized to configure the signal generator to output a beam at a selected wavelength.

FIG. 17 shows an embodiment of the data structure associated with the lookup table 212 utilized during open loop operation of the signal generator 250 (See FIG. 2). During open loop operation, the processor 206 (See FIG. 2) responds to the user selection of a specific output wavelength by implementing processes (See FIG. 19) which in conjunction with the lookup table result in the appropriate drive signals being delivered to the actuator (See FIG. 2) so as to cause the laser to emit an output beam at the selected wavelength. Database 212 comprises a number of wavelength records, each of which contains a wavelength field 1704 and a drive signal/pulse field 1702. A first of the wavelength records, i.e. the base record, additionally contains a flag 1700 indicating that it is the starting point for further calculations. In an embodiment of the invention, this flag would be the beginning of file (BOF) or end of file (EOF) indicator or a specific starting address within the database in which the lookup table 212 was contained. In the embodiment shown, the first record has entries of "0" for a pulse count and a wavelength of 1525 nm. The second record has a pulse count of 4 and a wavelength of 1525.5 nm. The third record has a pulse count of 8 and a wavelength of 1526 nm. In the embodiment shown, the pulses are total cumulative pulses required to move the actuator from the base wavelength to the wavelength associated with the cumulative number of pulses. The following process flow FIG. 18 shows the processes associated with generating the lookup table.

Figure 18:
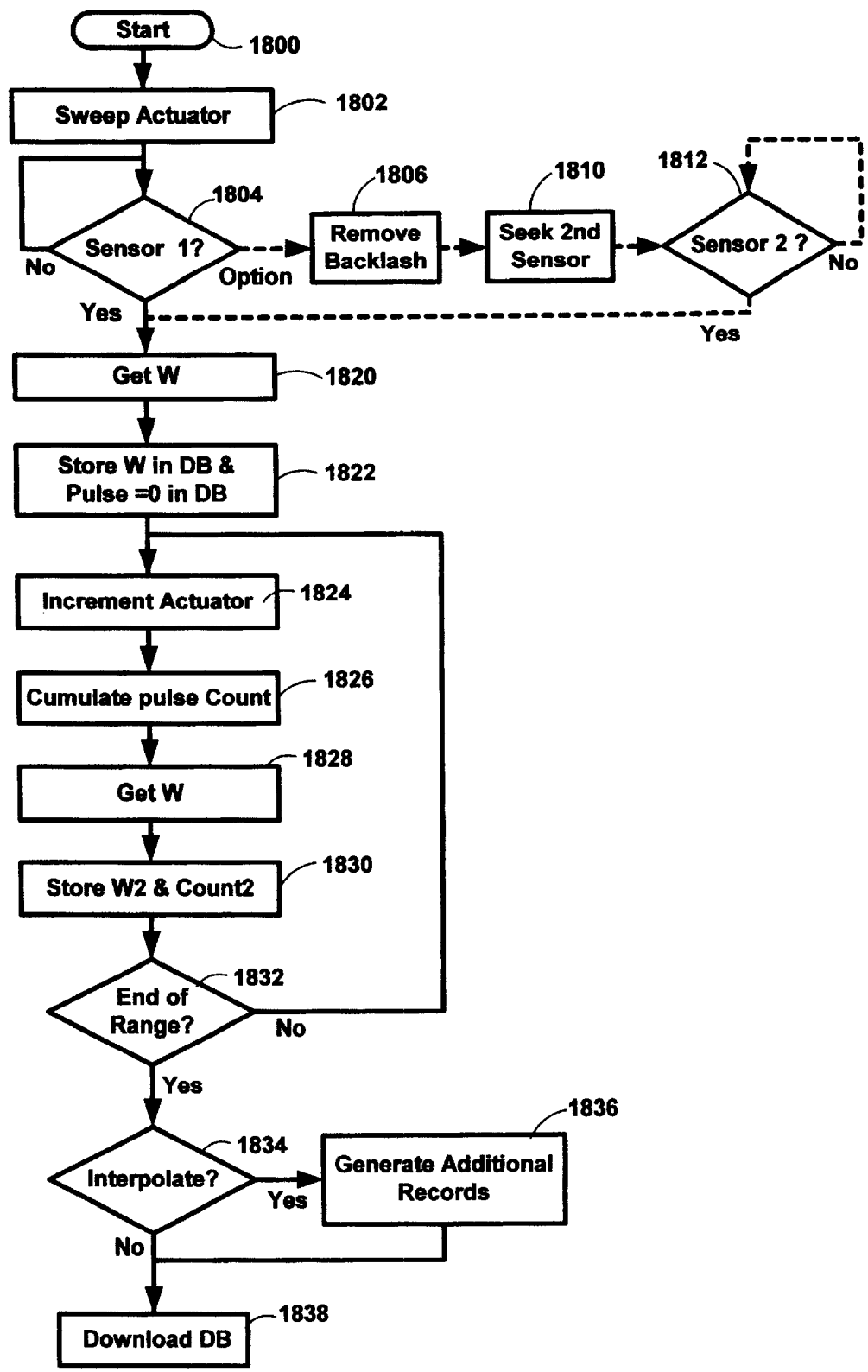
FIG. 18 shows an embodiment of the processes associated with generating the lookup table.

FIG. 18 is a process flow diagram showing the processes associated with generating the lookup table 212 (See FIG. 10). Processing begins at start block 1800, in which the system for driving the signal generator 250 and for measuring the output wavelength from the wavelength meter 110 and storing that wavelength in a lookup table, are initiated. Control then passes to process 1802. In process 1802 the actuator 230 is gradually swept from a starting position until, in the following decision step 1804, a signal is received from a first start condition sensor indicating that the base state has been reached. In an embodiment of the invention, that sensor, e.g. sensor 390 and/or 392 (See FIGS. 3–9) indicates that the start/base position for the pivot arm has been reached. Control then passes to process 1820.

In an embodiment of the invention which implements a combined linear and rotational sensor such as that shown in FIG. 9, control may alternately pass from decision process 1804 to processes 1806–1812 for a base state determination by a second sensor. In process 1806, any backlash is removed from the drive system by sending appropriate activating pulses to the actuator. Control is then passed to process 1810 in which the actuator is energized. Control then passes to decision process 1812 in which a determination is made as to when a second sensor, e.g. sensor 392 (See FIG. 3) indicates that the base position has been reached. When this determination is made, control is passed to process 1820.

In process 1820, the measurement of the output wavelength at the base position is obtained from the wavelength meter 1000 (See FIG. 10). Control is then passed to process 1822. In process 1822, the wavelength measurement is stored in the first record in the database along with the drive signal sequence/amount associated with the base position, e.g. a pulse count of "0". Control is then passed to process 1824. In process 1824 the processor 206 (See FIG. 10) or its equivalent sends a fixed sequence/type/number of activation signals to the actuator 230 which results in the tuning of the laser to a next wavelength level. Control is then passed to process 1826. In process 1826 the pulses generated in process 1824 are added to the previous amount to generate a cumulative pulse count. Control is then passed to process 1828. In process 1828 the wavelength measurement made by the wavelength meter 1000 (See FIG. 10) is obtained. Control is then passed to process 1830. In process 1830 the wavelength obtained in process 1828 and the cumulative pulse count obtained in process 1826 are combined into a single record which is stored in a database 212 (See FIG. 2). Control is then passed to decision process 1832. In decision process 1832 a determination is made as to whether the last wavelength obtained in process 1828 lies at the end of the operating range of the signal generator. In the event that determination is in the negative, control returns to process 1824 for the next increment of the actuator. Alternately, if in decision process 1832 an affirmative is reached, that the signal generator has reached the end of the operating range, control is then passed to decision process 1834. In decision process 1834 a determination is made as to whether additional records will be generated by interpolation. If that determination is negative, then control is passed to process 1838. If the determination is affirmative, control passes to process 1836. In process 1836 an interpolation is performed using existing records in the database, and additional records corresponding to interpolations between the initial records in the database are added to the database. These additional interpolated records each have a pulse count offset from the base and a wavelength. Then control passes to process 1838. In process 1838 the completed database with records correlating pulse count and wavelength is stored in memory 208 (See FIGS. 2–10). In an alternate embodiment of the invention multiple traces, averages, curve fitting may be used to generate additional records. In still another embodiment of the invention, measurements of drive signals and output wavelengths may be made across the tuning range to establish a functional relationship between wavelength and drive signals. In this embodiment, the lookup table would contain the single function correlating wavelength with drive signals rather than a plurality of records.

Figure 19:
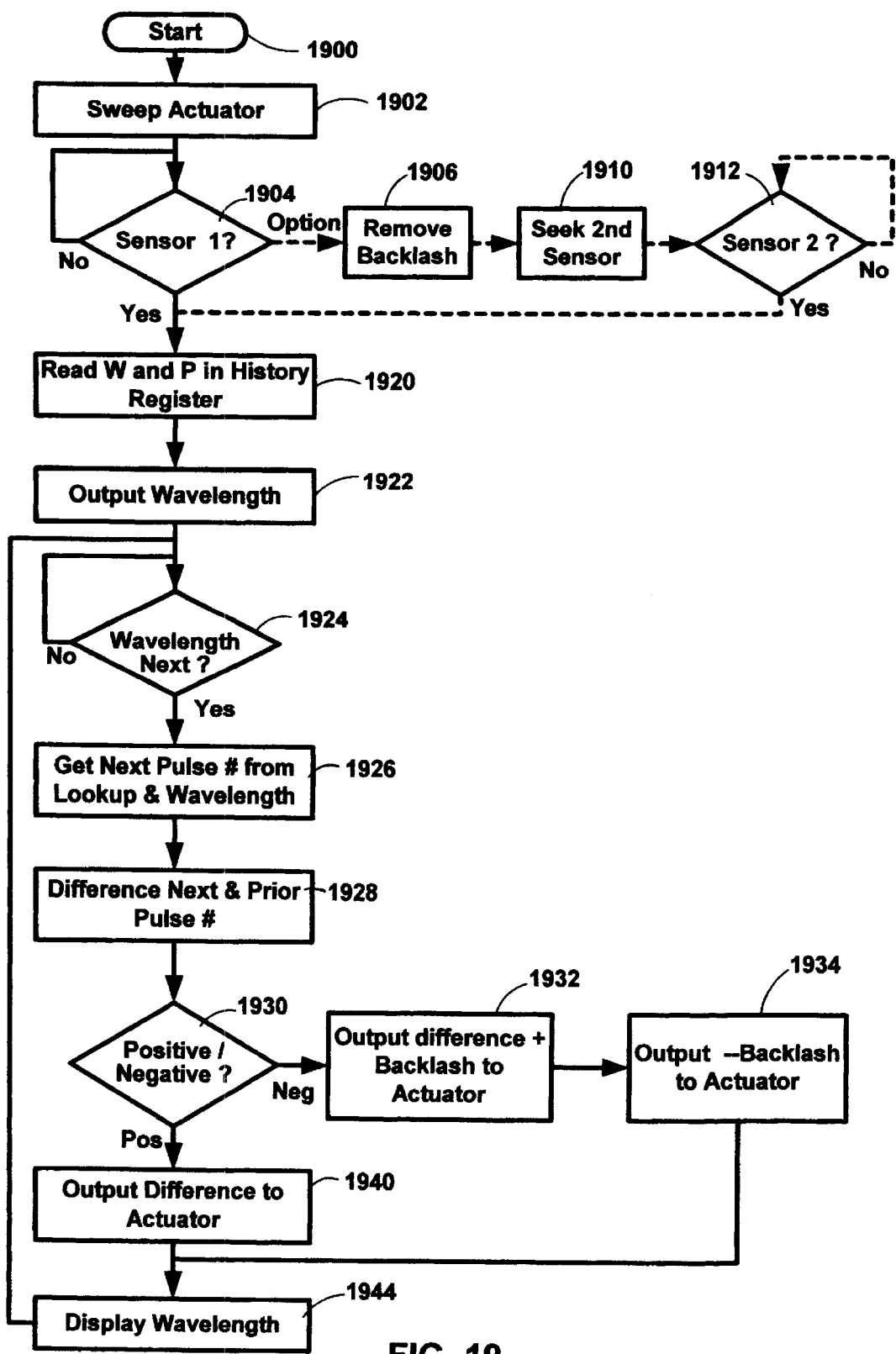
FIG. 19 shows an embodiment of the processes associated with selecting an output wavelength for the signal generator.

FIG. 19 is a process flow diagram showing the processes associated with operation of the signal generator portion of the multimeter 100.

Processing begins at start block 1900 in which the signal generator is initialized. Control then proceeds to process 1902. In process 1902 the CPU 206 (See FIG. 10) outputs drive pulses to the stepper motor causing it to initiate a slow sweep from a start position. Control is then passed to decision process 1904. In decision process 1904 a determination is made as to whether a start condition sensor has signaled the base position. In the event that determination is in the affirmative, control may optionally be passed to additional processes 1906–1912 for the confirmation of a second sensor as to the base condition. Alternately, control is passed directly to process 1920.

In optional process 1906 any backlash in the drive train is removed and control is passed to process 1910. In process 1910 the processor outputs drive signals to the stepper motor. Control is then passed to decision 1912. In decision process 1912, a determination is made as to when a signal is received from the second sensor, e.g. sensor 392, indicating a base position. Control is then passed to process 1920.

In process 1920 the wavelength and pulse count for the base position are read from the lookup table 212 (See FIGS. 2, 10). These are stored in the history register. Control is then passed to process 1922. In process 1922 the wavelength value read from the base record in the lookup table may be displayed on display 200 (See FIG. 2). Control is then passed to decision process 1924. In decision process 1924 a determination is made as to when the next output channel/ center wavelength has been selected. Selection may result from a number of input sources. These sources include entries from the user via user inputs 202 (See FIG. 2) or from program code stored in memory 208 and having a specific operating regime for the signal generator. In either event, once a determination is made that the next wavelength/ channel has been indicated, control is then passed to process 1926. In process 1926 a lookup is performed on the lookup table/database using the wavelength obtained in decision process 1924. If the next wavelength corresponds to that of a wavelength record in the database, then that record including the associated cumulative pulse count is read by the processor 206. Alternately, if the target wavelength does not match any of the records of the database, then the two closest records in the database are obtained and an interpolation of the pulse count stored in each is performed to generate a cumulative pulse count or drive signal profile which lies in between the two records. Control is then passed to process 1928. In process 1928, the pulse count stored in the history register in process 1920 is subtracted from the pulse count obtained in process 1926. Control is then passed to decision process 1930. In decision process 1930 a determination is made as to whether the difference obtained in decision process 1928 has a positive or negative value. If the value is positive, indicating that movement of the actuator in the same direction is appropriate to achieve the next output wavelength, then control is passed directly to process 1940. Alternately, if the difference obtained is negative, control is passed to intermediate process 1932. In intermediate process 1932 appropriate pulses are output, e.g. amounting to the difference obtained in process 1928 plus an additional backlash value. Control is then passed to process 1934 in which the backlash is reversed. Control is then passed directly to process 1944 in which the wavelength obtained in decision process 1924 is displayed to the user.

Alternately, if in decision process 1930 a determination is made that the difference is positive then control is passed directly to process 1940. A positive determination as discussed above indicates that there is no backlash/hysteresis to remove since the movement to the next wavelength selected is in the same direction as was utilized in the previous measurement. In process 1940 the pulse difference obtained in process 1928 is output by the processor to the actuator. Control is then passed to decision process 1944 in which the desired wavelength is displayed to the user. Then control returns to decision process 1924 for the processing of the next selected output wavelength.

The many features and advantages of the present invention are apparent from the written description, and thus, it is intended by the appended claims to cover all such features and advantages of the invention. Further, since numerous modifications and changes will readily occur to those skilled in the art, it is not desired to limit the invention to the exact construction and operation as illustrated and described. Hence, all suitable modifications and equivalents may be resorted to as falling within the scope of the invention.

What is claimed is:

1. A tunable laser, comprising:

a base;

a gain medium coupled to the base;

a tunable feedback device coupled to said base to provide feedback of a selected wavelength to the gain medium; and a first compensating element providing the coupling to said base for one of said gain medium and said tunable feedback device such that thermal expansion of said first compensating element maintains a substantially constant integer number of half-wavelengths within a resonant cavity defined by the gain medium and the tunable feedback device during temperature variations in the tunable laser.

2. The tunable laser of claim 1, further comprising:

a diffraction element; and a tuning element coupled to said diffraction element to adjust an orientation of said diffraction element with respect to said gain medium to vary the selected wavelength.

3. The tunable laser of claim 1, further comprising:

a diffraction element having dispersion planes;

a retroreflector within the dispersion planes; and a tuning element for adjusting an orientation of at least one of said diffraction element and said retroreflector to vary the selected wavelength.

4. The tunable laser of claim 1, further comprising:

an interference element;

a retroreflector; and a tuning element for adjusting an orientation of said interference element to vary the selected wavelength.

5. The tunable laser of claim 1, further comprising:

a second compensating element providing the coupling to said base for an other of said gain medium and said tunable feedback device such that thermal expansion of said first compensating element and said second compensating element maintains a substantially constant integer number of half-wavelengths within a resonant cavity defined by the gain medium and the tunable feedback device during temperature variations in the tunable laser.

6. The tunable laser of claim 1, further comprising:

a contact pad between said first compensating element and said base;

a leveling pad between said first compensating element and said base; and a fastener for fastening said first compensating element together with one of said gain medium and said tunable feedback device to said base, and the fastener positioned between said contact pad and said leveling pad to apportion a fastening force to permit relative movement between said leveling pad and at least one of said base and said first compensating element and to substantially reduce relative movement of said base and said contact pad thereby providing at said contact pad a single location from which to determine the required thermal expansion characteristics of said first compensating element.

7. The tunable laser of claim 6, wherein said contact pad provides one of: two points of contact between said base and said first compensating element, and a line of contact between said base and said first compensating element.

8. The tunable laser of claim 6, wherein the line of contact provided by said contact pad between said base and said first compensating element lies substantially orthogonal to an optical path within the resonant cavity.

9. The tunable laser of claim 6, wherein one of said base and said first compensating element define at least one of said contact pad and said leveling pad integral with a respective surface portion thereof.

10. A tunable laser, comprising:

a base;

a gain medium coupled to the base;

a first feedback device coupled to the base to provide feedback of a selected wavelength to said gain medium;

a pivot arm with a proximal and a distal end, and the proximal end of said pivot arm pivotally attached to the base at a first pivot axis;

a second feedback device coupled to the distal end of said pivot arm to provide feedback of the selected wavelength to said first feedback device, and said second feedback device together with said first feedback device and said gain medium defining a resonant cavity, and the second feedback device responsive to the arcuate displacement of said pivot arm to vary the selected wavelength; and a first compensating element coupling the second feedback device to the distal end of said pivot arm such that thermal expansion of said first compensating element maintains a substantially constant integer number of half-wavelengths within the resonant cavity.

11. The tunable laser of claim 10, wherein the positioning of the first pivot axis provides both rotation and translation of the second feedback device with respect to the first feedback device during the arcuate displacement of said pivot arm to vary the selected wavelength together with maintaining a substantially constant integer number of half-wavelengths in the resonant cavity.

12. The tunable laser of claim 10, wherein the first feedback element includes a diffraction element and the second feedback device includes a retroreflector.

13. The tunable laser of claim 10, wherein the first feedback element includes a retroreflector and the second feedback device includes an interference element.

14. The tunable laser of claim 10, further comprising:
a second compensating element coupling said gain medium to said base such that thermal expansion of said first compensating element and said second compensating element maintains a substantially constant integer number of half-wavelengths within the resonant cavity.

15. The tunable laser of claim 14, further comprising:
a contact pad between said second compensating element and said base;
a leveling pad between said second compensating element and said base; and
a fastener for fastening said second compensating element together with said gain medium to said base, and the fastener positioned between said contact pad and said leveling pad to apportion a fastening force to permit relative movement between said leveling pad and at least one of said base and said second compensating element and to substantially reduce relative movement of said base and said contact pad thereby providing at said contact pad a single location from which to determine the required thermal expansion characteristics of said second compensating element.

16. The tunable laser of claim 15, wherein the contact pad provides one of: two points of contact between said base and said second compensating element, and a line of contact between said base and said second compensating element.

17. The tunable laser of claim 16, wherein the line of contact provided by said contact pad between said base and said second compensating element lies substantially orthogonal to an optical path within the resonant cavity.

18. The tunable laser of claim 15, wherein one of said base and said second compensating element define at least one of said contact pad and said leveling pad integral with a respective surface portion thereof.

19. A laser apparatus comprising:
(a) first and second optical elements positioned to define a resonant optical cavity; and
(b) a compensating element associated with at least one of said optical elements, said compensating element configured such that thermal expansion of said compensating element offsets thermal expansion of said resonant optical cavity, wherein said first and second optical elements comprise first and second reflectors, said compensating element coupled to at least one of said reflectors, said compensating element configured such that thermal expansion of said compensating element maintains a substantially constant integer number of half wavelengths within said resonant optical cavity.

20. The laser apparatus of claim 19, wherein said first reflector is tunable, said compensating element coupled to said first reflector.

21. The laser apparatus of claim 20, further comprising a base, said compensating element coupled to said base.

22. The laser apparatus of claim 21, wherein said second reflector comprises a facet of a gain medium associated with said resonant optical cavity.

23. The laser apparatus of claim 19, wherein said first optical element is a tunable feedback element, said compensating element coupled to said tunable feedback element.

24. The laser apparatus of claim 23, further comprising a drive system coupled to said compensating element and said tunable feedback element.

25. The laser apparatus of claim 23, wherein said second optical element comprises a reflective facet of a gain medium associated with said resonant optical cavity.

26. The laser apparatus of claim 24, further comprising a base, said drive system coupled to said base.

27. A laser apparatus comprising:
(a) means for defining a resonant optical cavity, said means for defining said resonant optical cavity comprises first and second reflectors; and
(b) thermal compensating means for offsetting thermal expansion of said resonant optical cavity, said thermal compensating means coupled to at least one of said reflectors and configured such that thermal expansion of said compensating element maintains a substantially constant integer number of half wavelengths within said resonant optical cavity.

28. The laser apparatus of claim 27, wherein said first optical element comprises tunable feedback means for selecting a wavelength, said thermal compensating means coupled to said tunable feedback means.

29. The laser apparatus of claim 27, further comprising drive means for tuning said tunable feedback means, said thermal compensating means coupled to said drive means.

30. A method for thermally stabilizing a resonant optical cavity, comprising:
(a) positioning first and second optical elements to define said resonant optical cavity; and
(b) offsetting thermal expansion of said resonant optical cavity by thermally compensating at least one of said optical elements, wherein said offsetting said thermal expansion comprises maintaining a substantially constant integer number of half wavelengths within said resonant optical cavity.

31. The method of claim 30, wherein said offsetting said thermal expansion comprises coupling a compensating element to said at least one optical element, said compensating element configured such that thermal expansion of said compensating element offsets thermal expansion of said resonant optical cavity.

32. The method of claim 30, further comprising tuning at least one of said optical elements.

33. The method of claim 32, wherein said offsetting said thermal expansion comprises coupling said compensating member to a drive system, said drive system configured to tune said at least one optical element.

* * * * *